(12) United States Patent
Takeuchi et al.

(10) Patent No.: US 6,596,578 B2
(45) Date of Patent: Jul. 22, 2003

(54) SEMICONDUCTOR DEVICE AND MANUFACTURING METHOD THEREOF

(75) Inventors: Yuji Takeuchi, Yokohama (JP); Fumitaka Arai, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 10/216,732

(22) Filed: Aug. 13, 2002

(65) Prior Publication Data

US 2003/0003664 A1 Jan. 2, 2003

Related U.S. Application Data

(62) Division of application No. 09/920,859, filed on Aug. 3, 2001, now Pat. No. 6,531,357.

(30) Foreign Application Priority Data

Aug. 17, 2000 (JP) ........................................ 2000-247702
Aug. 30, 2000 (JP) ........................................ 2000-261430

(51) Int. Cl.[7] .......................................... H01L 21/8242
(52) U.S. Cl. ...................................................... 438/241
(58) Field of Search ................................. 438/239, 241, 438/253

(56) References Cited

U.S. PATENT DOCUMENTS

| | | | |
|---|---|---|---|
| 5,557,123 A | 9/1996 | Ohta | 257/315 |
| 6,074,910 A | 6/2000 | Lin | 438/253 |
| 6,291,847 B1 | 9/2001 | Ohyu et al. | 257/306 |
| 6,294,422 B1 | 9/2001 | Sunouchi | 438/241 |

FOREIGN PATENT DOCUMENTS

JP 2000-150828 5/2000

*Primary Examiner*—David Nelms
*Assistant Examiner*—Thao Le
(74) *Attorney, Agent, or Firm*—Oblon, Spivak, McClelland, Maier & Neustadt, P.C.

(57) ABSTRACT

As wiring patterns in a region for connecting two line & space pattern sets having different line & space widths on a semiconductor substrate, even-numbered line patterns in a region having a smaller line & space width are connected to line patterns in a region having a larger line & space width and thicken their line widths stepwise in the middle of the lengthwise direction, and odd-numbered line patterns in the region having the smaller line & space width terminate at different positions in a connection region. Upon forming a fine wiring pattern on the connection region using photolithography, the resolution and depth of focus can be suppressed from impairing.

18 Claims, 32 Drawing Sheets

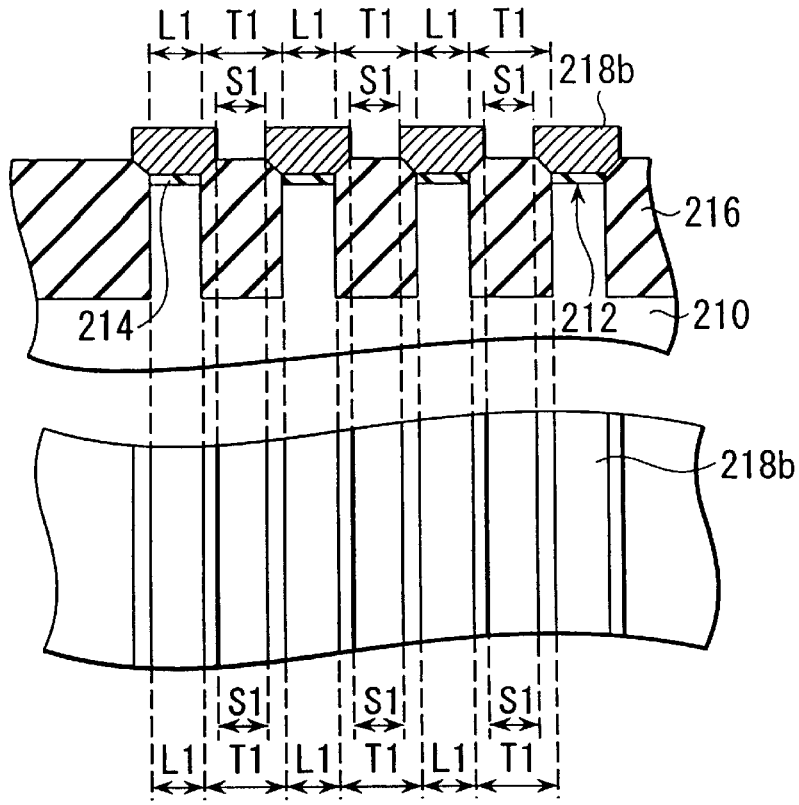
FIG. 27A PRIOR ART
FIG. 27B PRIOR ART
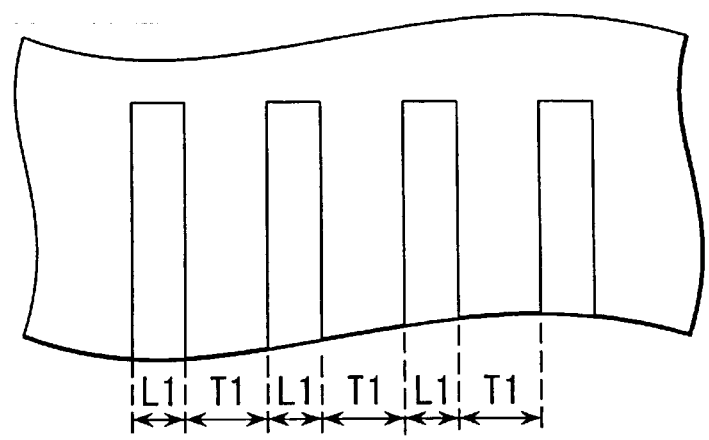
FIG. 28A PRIOR ART
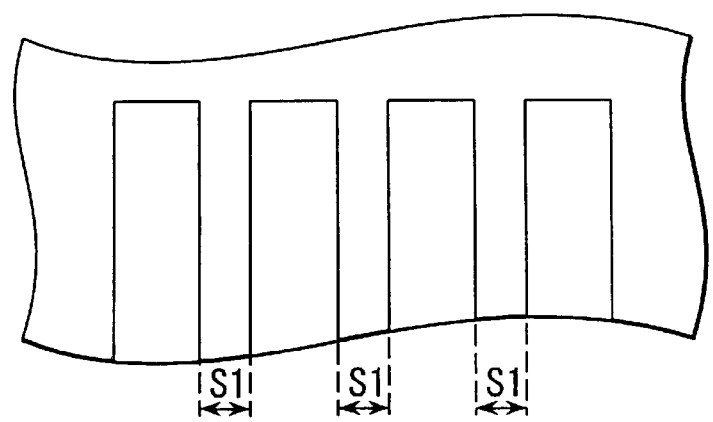
FIG. 28B PRIOR ART

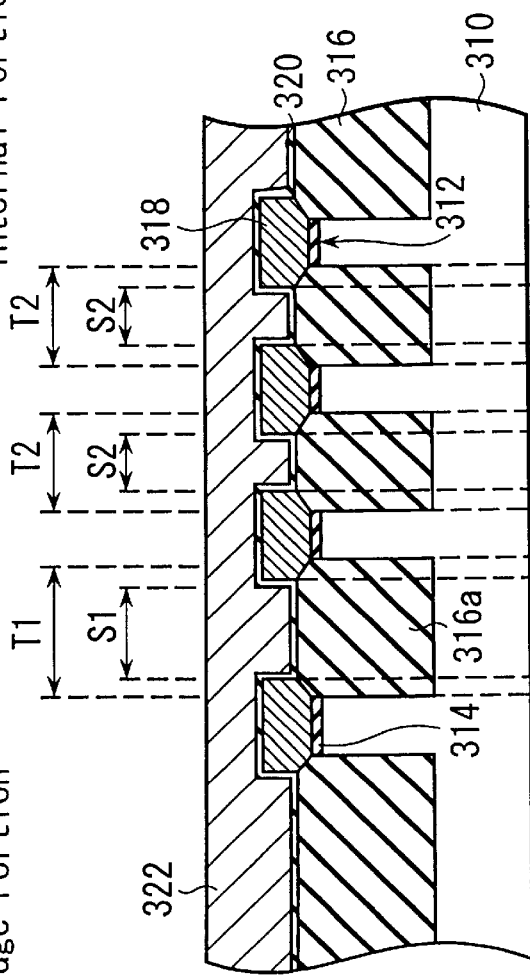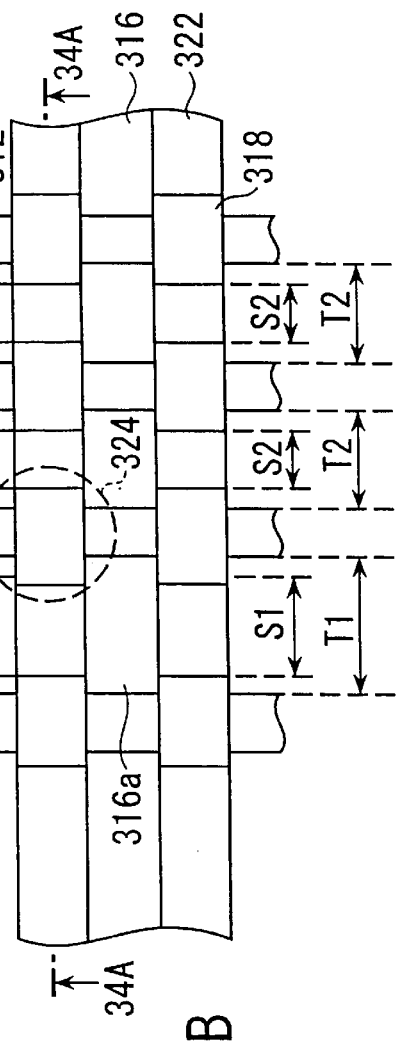
FIG. 34A
FIG. 34B

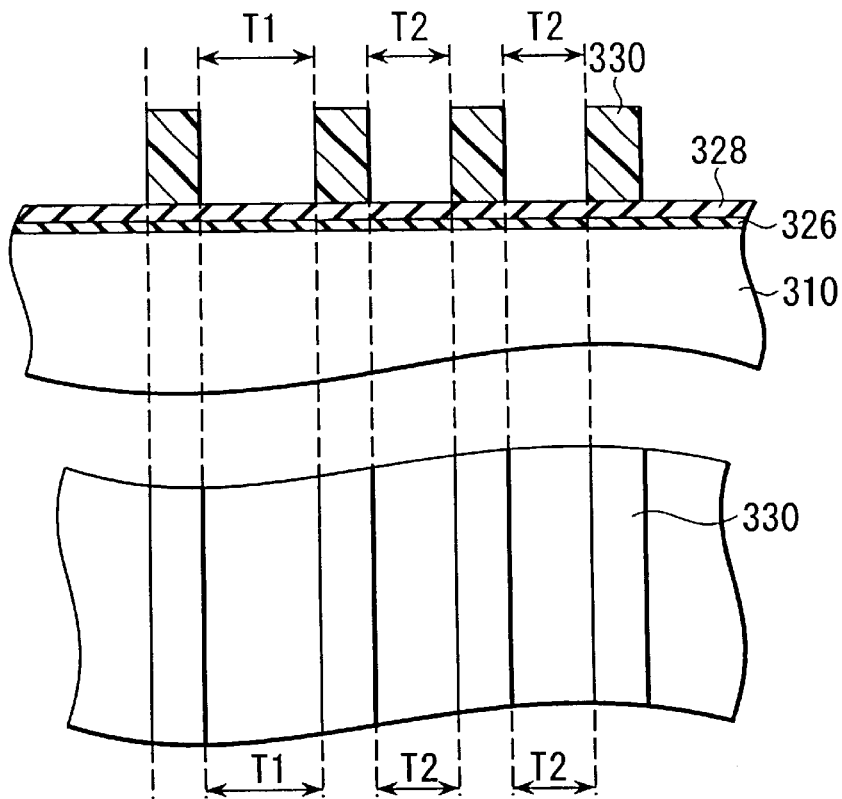
FIG. 35A
FIG. 35B
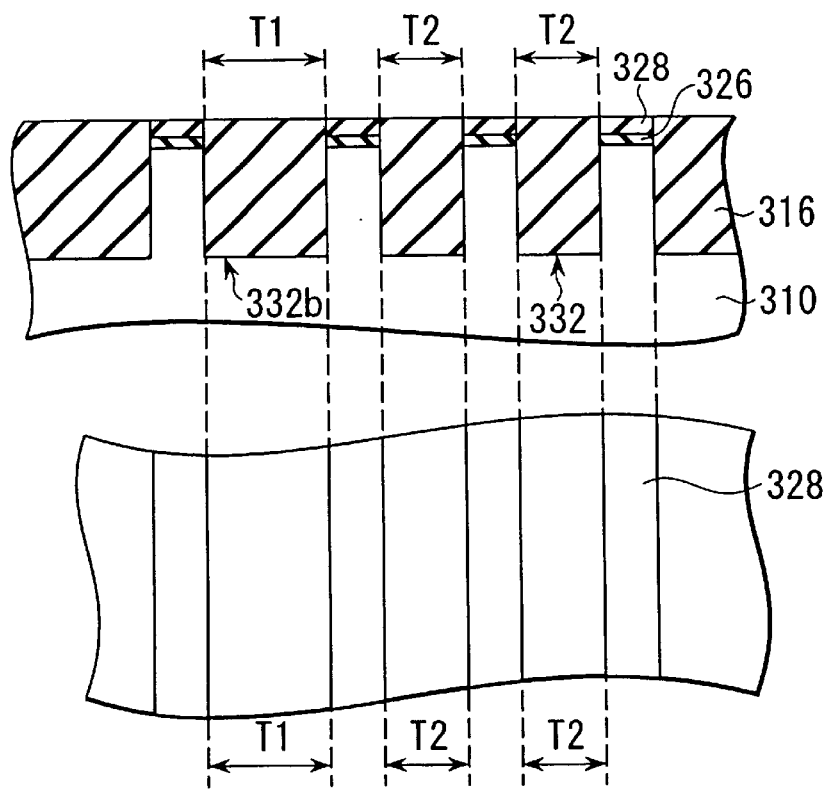
FIG. 36A
FIG. 36B

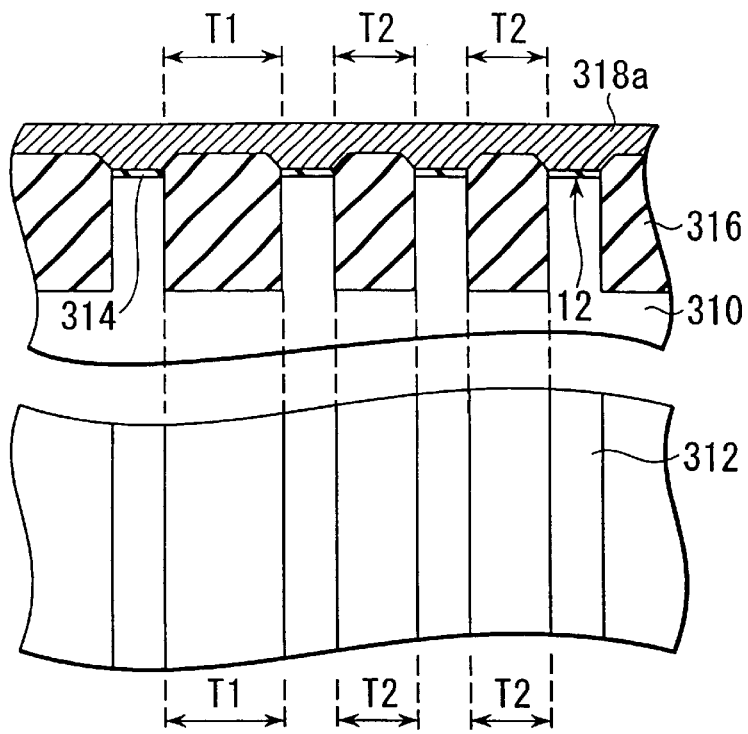
FIG. 37A
FIG. 37B
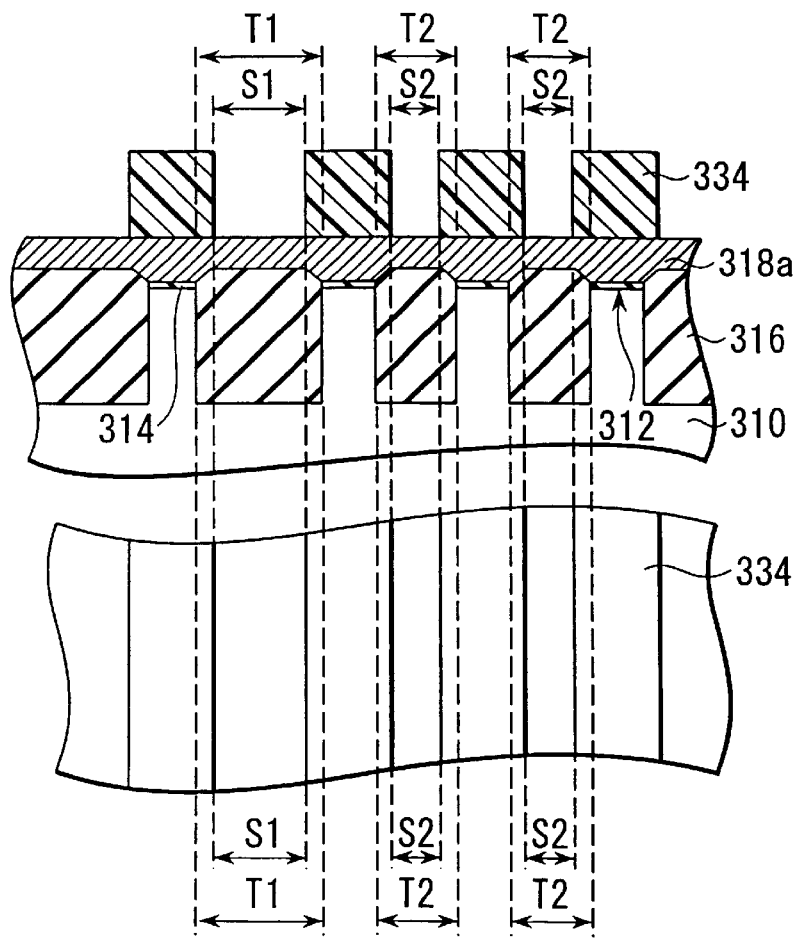
FIG. 38A
FIG. 38B

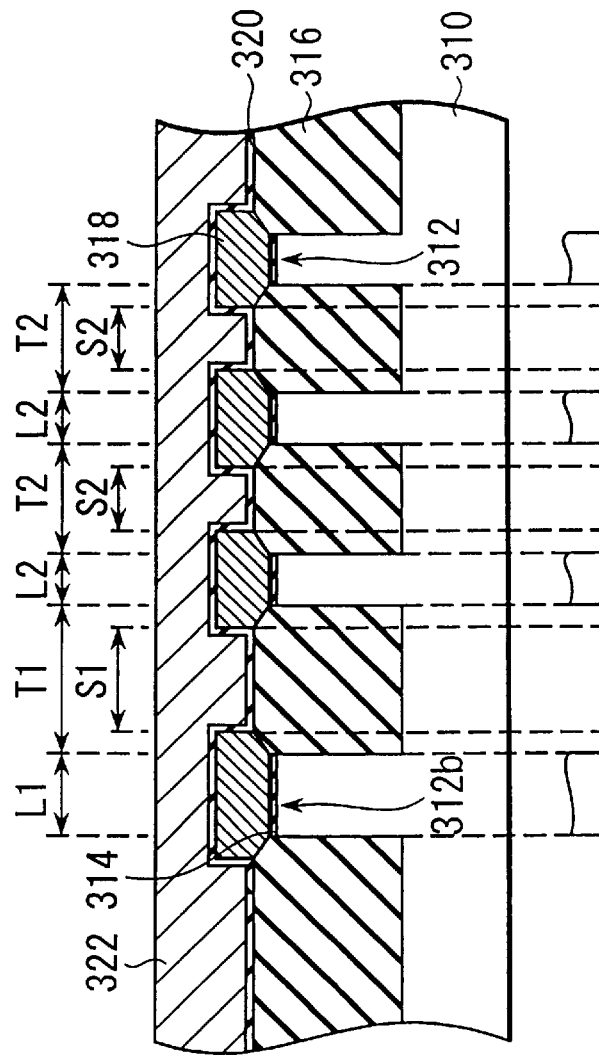
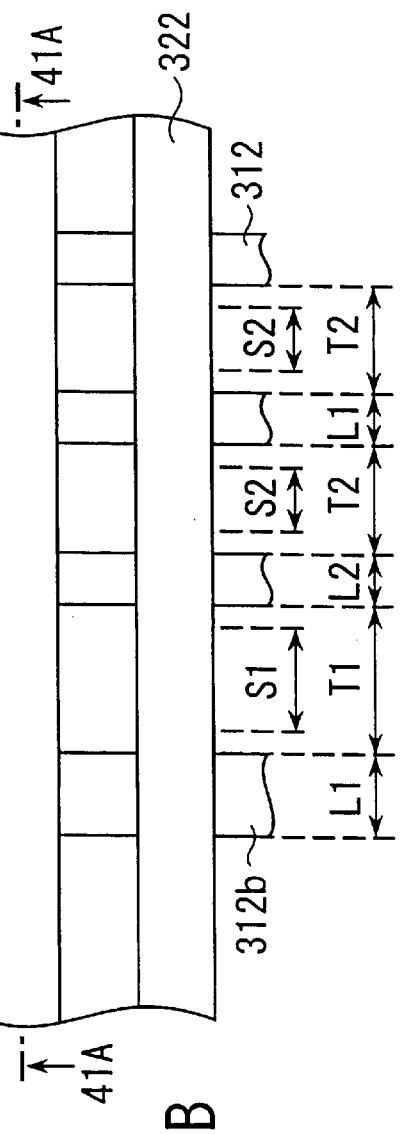
FIG. 41A
FIG. 41B

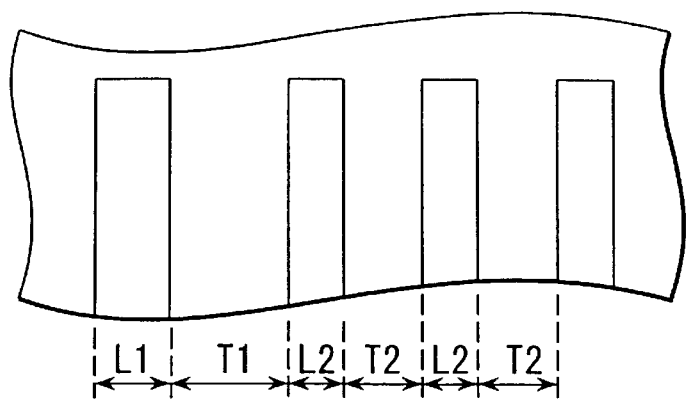
FIG. 42A
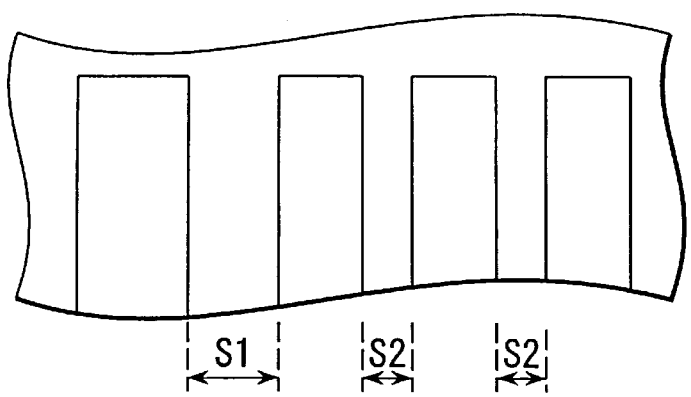
FIG. 42B
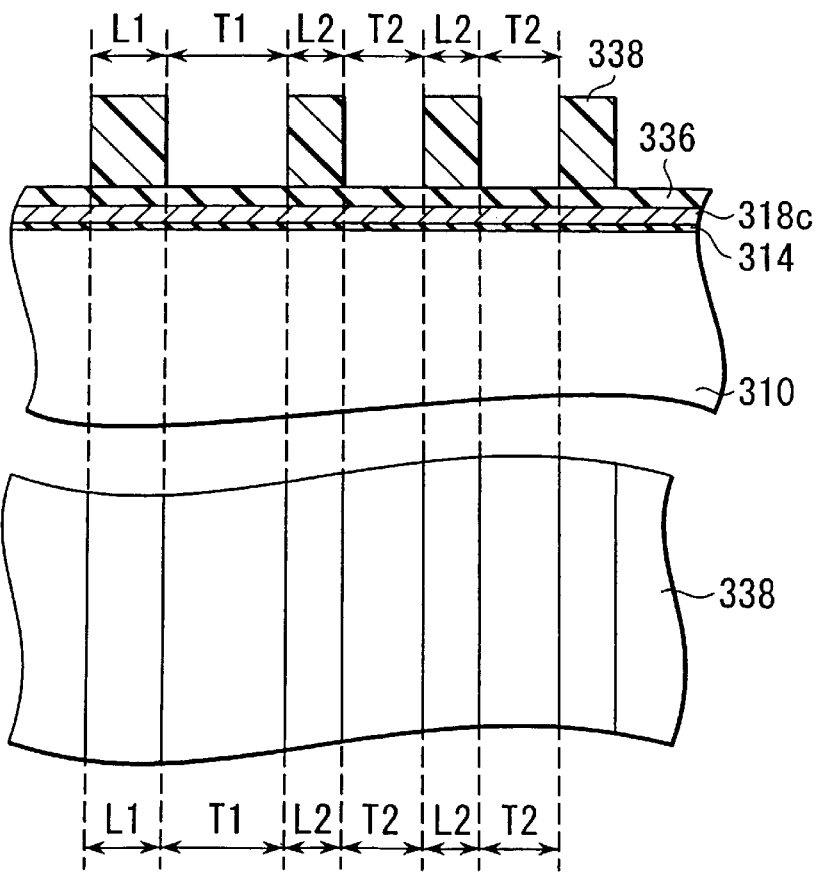
FIG. 44A
FIG. 44B

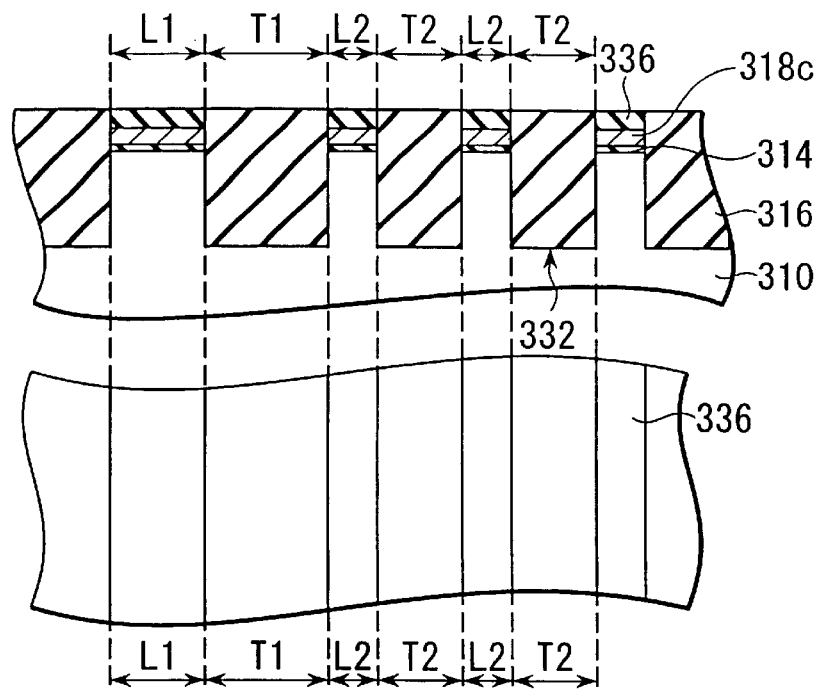
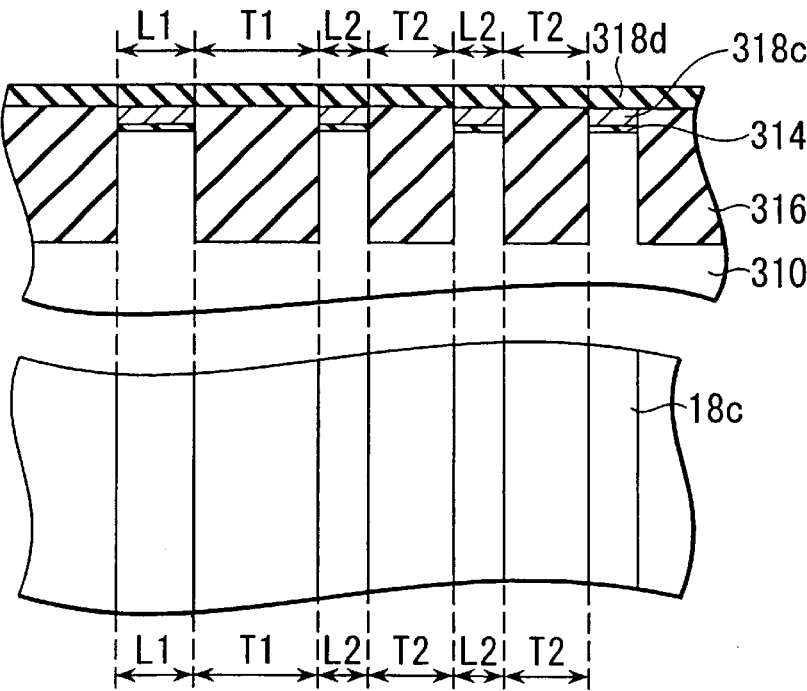

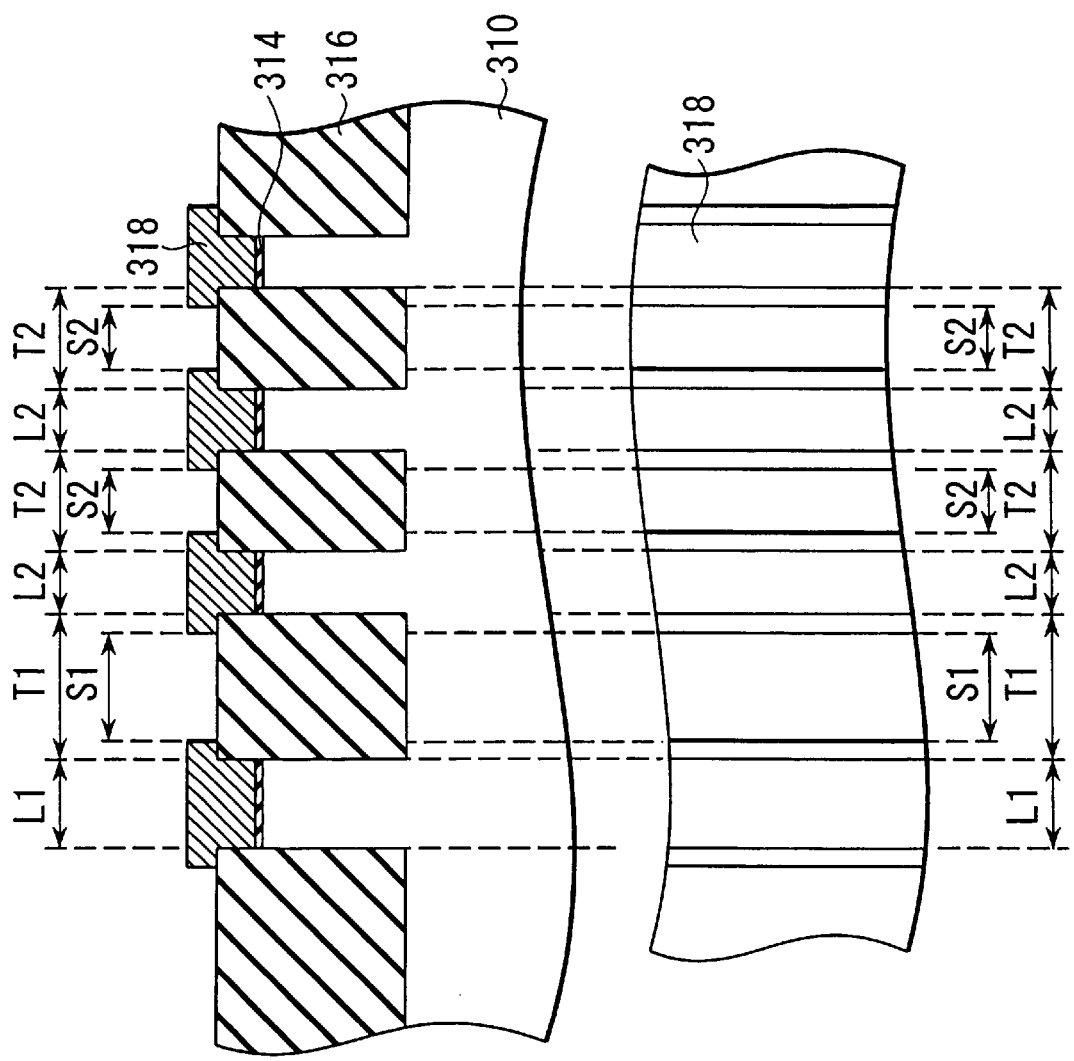

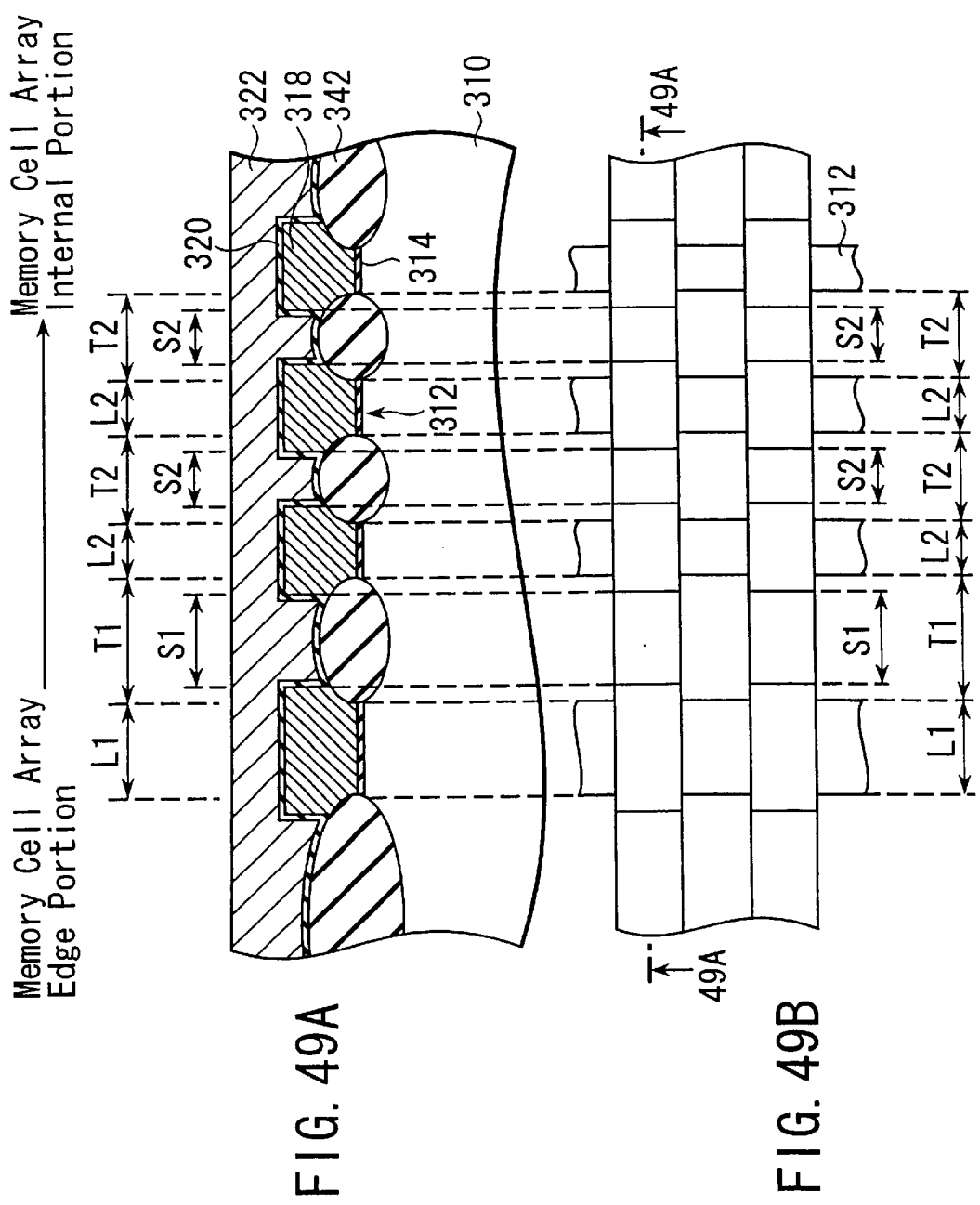

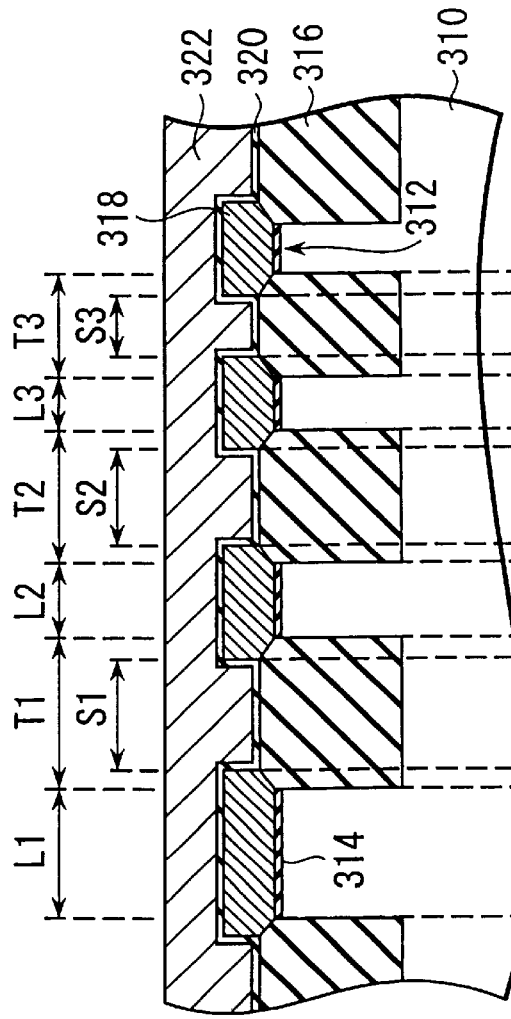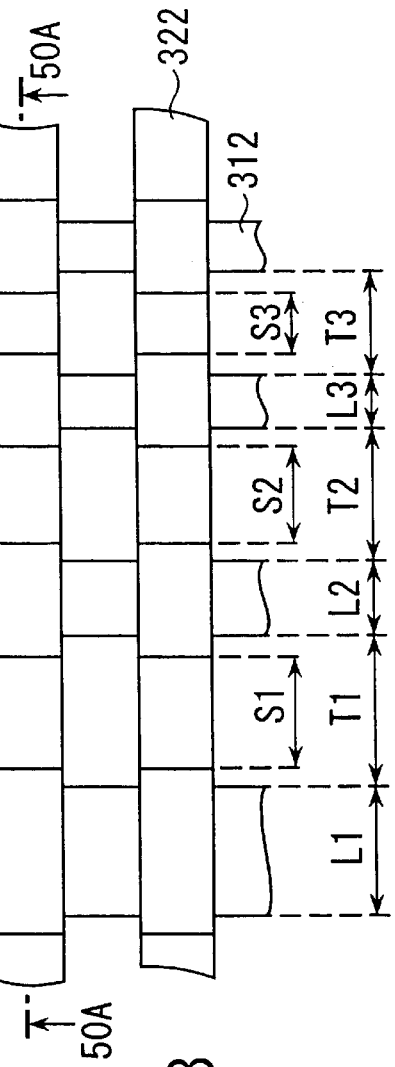
FIG. 50A
FIG. 50B

SEMICONDUCTOR DEVICE AND MANUFACTURING METHOD THEREOF

CROSS-REFERENCE TO RELATED APPLICATIONS

This application is a Divisional of commonly owned U.S. patent application Ser. No. 09/920,859 filed Aug. 3, 2001 entitled "SEMICONDUCTOR DEVICE AND MANUFACTURING METHOD THEREOF" now U.S. Pat. No. 6,531,357 which is incorporated herein by reference in its entirety. This application is based upon and claims the benefit of priority from the prior Japanese Patent Applications No. 2000-247702, filed Aug. 17, 2000; and No. 2000-261430, filed Aug. 30, 2000, the entire contents of both of which are incorporated herein by reference.

BACKGROUND OF THE INVENTION

1. Field of the Invention

The present invention relates to a semiconductor device and a manufacturing method thereof and, more particularly, to a wiring pattern in a region where wiring lines with different pitches are connected, a forming method thereof, and a semiconductor pattern exposure mask used in that method. The present invention is applied to, e.g., a boundary region between a memory cell array region, and a memory cell peripheral circuit region of a semiconductor memory device.

2. Description of the Related Art

It is a common practice to use photolithography in the manufacture of semiconductor devices such as a semiconductor memory, microprocessor, and the like. Photolithography is a technique for irradiating a pattern exposure mask formed with a pattern with light rays, projecting the light rays onto a photoresist on a semiconductor substrate via an optical system to expose the photoresist, and transferring the pattern on the mask onto the semiconductor substrate.

Miniaturization of semiconductor devices is in progress to achieve high integration and low cost. For this purpose, miniaturization of a pattern formed by photolithography must be realized first.

In general, a resolution R and depth of focus DOF in photolithography are expressed by Rayleigh's equations:

$$R = k1(\lambda/NA)$$

$$DOF = k2(\lambda/NA^2)$$

where $\lambda$: the wavelength of irradiation light, NA: the numerical aperture, and k1 and k2: process constants and the like.

As can be seen from the above equations, it is effective to shorten the wavelength of irradiation light so as to transfer a fine pattern. As a light source of a conventional exposure system, i-line having a wavelength of 365 nm is normally used. In order to form a finer pattern, a KrF excimer laser having a wavelength of 248 nm is currently normally used.

In order to promote further miniaturization, it is required to use a light source of a shorter wavelength, to decrease k1 and k2, and to increase the numerical aperture NA (high NA). As the light source of a short wavelength, an ArF excimer laser having a wavelength of 193 nm is hopeful. However, it is difficult to develop an optical system, photoresist, and the like for the ArF excimer laser, and such system has not reached a practical use yet. Although k1 and k2 can be reduced by improving the resist and process, their limit values are around 0.4 to 0.5. Too high an NA is not practical since it is difficult to work a high-NA lens that can cover a large area upon exposure. In addition, a certain depth of focus or more must be assured in actual exposure. However, since the depth of focus drops with increasing NA, as can be seen from the Rayleigh's equations, it is difficult to achieve a high NA in this respect as well.

As described above, improvement of resolution achievable by only improving the wavelength, numerical aperture, and process is limited. Hence, so-called super resolution techniques such as a method using an attenuated phase shifting mask, a method using off-axis illumination upon exposure of a mask pattern, and the like are used as that for further improving resolution. The super resolution technique will be briefly explained below.

In the attenuated phase shifting mask, a translucent film having a transmittance of 3 to 10% is normally formed in place of a chromium film to transmit light so as not to perfectly intercept light even at a line pattern portion, and the phase of transmission light is shifted 180°. At this time, the resolution is improved by forming a steep light intensity distribution at the boundaries between line and space patterns by coherence produced between light transmitted through the line pattern portion and that transmitted through the space pattern portion. By contrast, in a normal mask, a line pattern portion is normally formed of chromium or the like to intercept light so as to prevent the photoresist from being exposed.

In off-axis illumination, an aperture that intercepts light components near the center of a light source is set to irradiate a mask with only obliquely incoming light components. When such off-axis illumination is used, either of ±1st-order diffracted light components are not projected, and the remaining diffracted light component is projected. In this way, the resolution can be improved by the method of forming an image using two luminous fluxes, i.e., 0th-order light and one of ±1st-order diffracted light components.

By contrast, in a normal illumination method, light which is emitted by a light source and with which a mask is irradiated forms an optical image on a semiconductor substrate since three luminous fluxes, i.e., 0th-order light and ±1st-order light components produced by diffraction are projected.

However, the aforementioned super resolution technique is effective to form periodic, dense patterns but can hardly form coarse patterns simultaneously with dense patterns. That is, it is possible to miniaturize patterns on a memory cell array region using the super resolution technique, but it is difficult to form desired patterns on a wiring connection region between the memory cell array region and a peripheral circuit region. In some cases, the patterns of the connection region limit the pitch of a memory cell array, resulting in an increase in chip size of a semiconductor memory.

As described above, in a conventional semiconductor memory, the resolution and depth of focus readily impair due to coherence of light upon forming wiring patterns using photolithography on a boundary region between a memory cell array region where line & space wiring patterns are formed at a very small pitch equal to or lower than the wavelength of a light source of an exposure system, and a peripheral circuit region where wiring patterns are formed at a patch larger than that in the former region. As a result, desired patterns cannot be formed, and disconnection and short-circuiting of wiring patterns readily occur.

It is the first object of the present invention to provide a semiconductor device which can prevent disconnection and short-circuiting of wiring patterns in a region where wiring lines or interconnects with different pitches are to be connected, and can achieve high integration. More specifically, the present invention has as its object to suppress the resolution and depth of focus from impairing upon forming wiring patterns using photolithography in the boundary region between a first region where line & space wiring patterns are formed via very small spaces equal to or smaller than the wavelength of a light source of an exposure system, and a second region where wiring patterns are formed via spaces larger than those of the first region.

It is the second object of the present invention to provide a semiconductor memory device, which can suppress any errors due to dimensional variations at the memory cell array edge portion of a semiconductor memory device and can realize high yield and high reliability, and its manufacturing method.

BRIEF SUMMARY OF THE INVENTION

A semiconductor device according to the first aspect of the present invention, comprises:

a semiconductor substrate;

a first line & space pattern set in which a first, a second, a third, and a fourth line pattern, each of which has a line width L and is made of a conductor, are aligned in turn via a line space S on a first region on the semiconductor substrate;

a second line & space pattern set in which a fifth and a sixth line pattern, each of which has not less than the line width L and is made of a conductor, are aligned in turn via not less than the line space S on a second region on the semiconductor substrate; and a third line & space pattern set in which a seventh line pattern, which is connected to the first and the fifth line pattern and is made of a conductor, and an eighth line pattern, which is connected to the third line pattern and the sixth line pattern and is made of a conductor, are formed on a third region present between the first and the second region on the semiconductor substrate, wherein the second line pattern terminates at a boundary position between the first and the third region, and the fourth line pattern runs to and terminates at a boundary position between the third region and the second region.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIGS. 22A and 22B show principal part of a memory cell array of a conventional semiconductor memory device, in which FIG. 22B is a plan view thereof, and FIG. 22A is a sectional view taken along a line 22A—22A in FIG. 22B;

FIGS. 23 to 27 (with suffices A and B) show the manufacturing processes of the semiconductor memory device shown in FIGS. 22A and 22B, in which the drawings with suffix A correspond to FIG. 22A, and the drawings with suffix B correspond to FIG. 22B;

FIGS. 28A and 28B are plan views showing principal part of a pattern on a reticle used in the manufacturing processes of the semiconductor memory device shown in FIGS. 22A and 22B, in which FIG. 28A shows a reticle used to transfer a photoresist pattern 230 shown in FIG. 23A onto a semiconductor substrate 210, and FIG. 28B shows a reticle used to transfer a photoresist pattern 234 shown in FIG. 26B onto the semiconductor substrate 210;

FIGS. 34A and 34B show principal part of a memory cell array of a semiconductor memory device according to the seventh embodiment of the present invention, in which FIG. 34B is a plan view thereof, and FIG. 34A is a sectional view taken along a line 34A—34A in FIG. 34B;

FIGS. 35 to 39 (with suffices A and B) show the manufacturing processes of the semiconductor memory device shown in FIGS. 34A and 34B, in which the drawings with suffix A correspond to FIG. 34A, and the drawings with suffix B correspond to FIG. 34B;

FIGS. 41A and 41B show principal part of a memory cell array of a semiconductor memory device according to the eighth embodiment of the present invention, in which FIG. 41B is a plan view thereof, and FIG. 41A is a sectional view taken along a line 41A—41A in FIG. 41B;

FIG. 42A shows principal part of a pattern on a reticle used to transfer a photoresist pattern that specifies element regions 312 and an isolation region 316 in FIG. 41A onto a semiconductor substrate 310;

FIG. 42B shows principal part of a pattern on a reticle used to transfer a photoresist pattern that specifies floating gate electrodes 318 in FIG. 41A onto the semiconductor substrate 310;

FIGS. 43A and 43B show principal part of a memory cell array of a semiconductor memory device according to the ninth embodiment of the present invention, in which FIG. 43B is a plan view thereof, and FIG. 43A is a sectional view taken along a line 43A—43A in FIG. 43B;

FIGS. 44 to 48 (with suffices A and B) show the manufacturing processes of the semiconductor memory device shown in FIGS. 43A and 43B, in which the drawings with suffix A correspond to FIG. 43A, and the drawings with suffix B correspond to FIG. 43B;

FIGS. 49A and 49B show principal part of a memory cell array of a semiconductor memory device according to the 10th embodiment of the present invention, in which FIG. 49B is a plan view thereof, and FIG. 49A is a sectional view taken along a line 49A—49A in FIG. 49B;

FIGS. 50A and 50B show principal part of a memory cell array of a semiconductor memory device according to the 11th embodiment of the present invention, in which FIG. 50B is a plan view thereof, and FIG. 50A is a sectional view taken along a line 50A—50A in FIG. 50B; and FIGS. 51A and 51B show principal part of a memory cell array of a semiconductor memory device according to the 12th embodiment of the present invention, in which FIG. 51B is a plan view thereof, and FIG. 51A is a sectional view taken along a line 51A—51A in FIG. 51B.

DETAILED DESCRIPTION OF THE INVENTION

Prior to a description of embodiments, problems in a connection region between a memory cell region and peripheral circuit region of a semiconductor memory device will be discussed.

Figure 1:
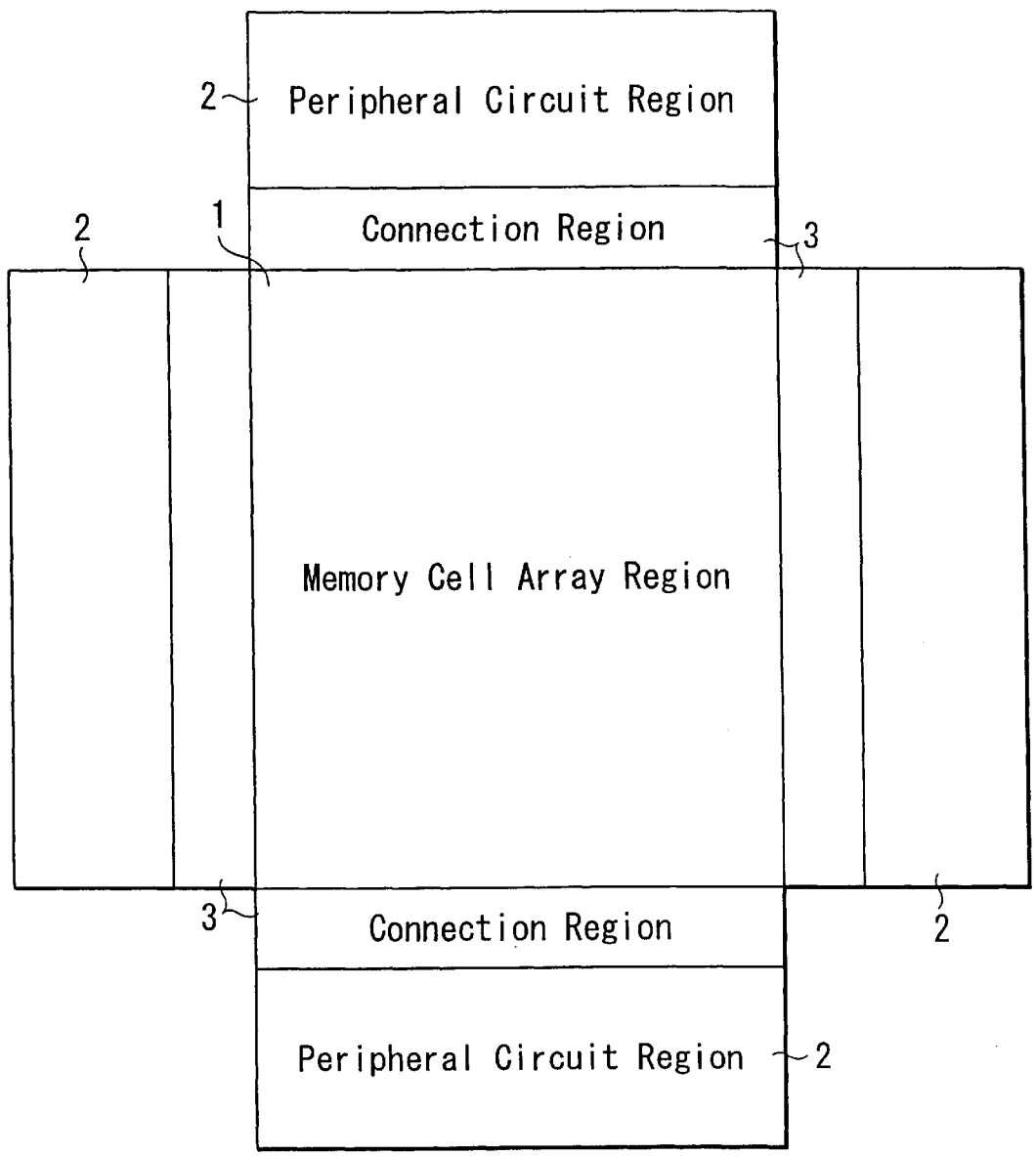
FIG. 1 shows a general layout of a semiconductor memory device.

FIG. 1 shows a general pattern layout of a semiconductor memory device. Peripheral circuit regions 2 that drive a memory cell array are laid out to surround a memory cell array region 1. Gate lines, metal wiring lines, and the like of the memory cell array region 1 are normally formed by dense patterns such as simple line & space patterns aligned periodically, but those of each peripheral circuit region 2 are formed by patterns coarser than the memory cell array region.

The gate lines and metal wiring lines on each peripheral circuit region 2 are formed by patterns more complicated than the memory cell array region 1 although they have periodicity to some extent. The gate lines and metal wiring lines on the memory cell array region 1 run to outside the memory cell array region 1, and are connected to those of each peripheral circuit region 2 via a connection region 3.

However, on each connection region 3 between the memory cell array region 1 and peripheral circuit region 2, since very fine line & space patterns in the memory cell array region 1 continue to run, and the periodicity of patterns is disturbed, the resolution and depth of focus on the connection region 3 readily impair. As a result, desired patterns cannot be formed, resulting in disconnection and short-circuiting of wiring lines.

Figure 2:
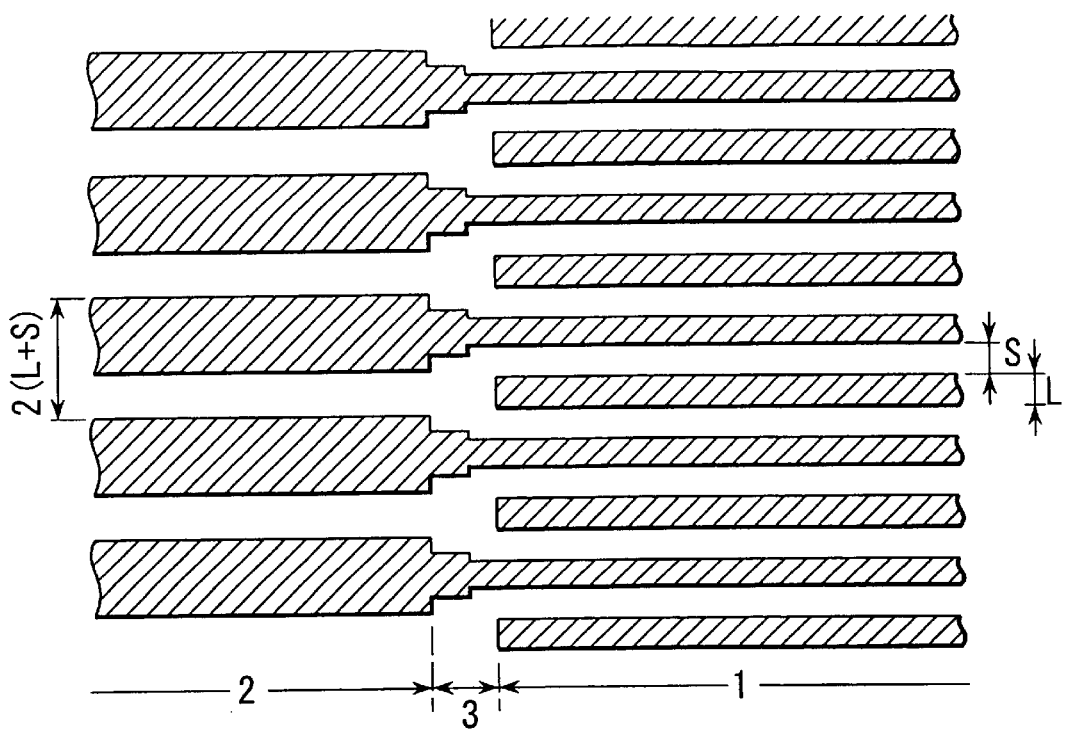
FIG. 2 is a partial plan view of a pattern exposure mask formed with a wiring pattern that connects a memory cell array region and peripheral circuit region in FIG. 1.

FIG. 2 shows a pattern exposure mask formed with a wiring pattern which connects the memory cell array region 1 and each peripheral circuit region 2 in FIG. 1.

Referring to FIG. 2, wiring patterns having a line width L, line space S, and pitch (L+S) are formed on the memory cell array region 1, wiring patterns having a pitch 2×(L+S) are formed on the peripheral circuit region 2, and wiring patterns for connecting, e.g., odd-numbered wiring patterns of the memory cell array region 1 to wiring patterns of the peripheral circuit region 2 are formed on the connection region 3. In this case, one-end portions of the remaining (even) wiring patterns of the memory cell array region 1 terminate on a boundary with the connection region 3, and their other-end portions are connected to wiring patterns (not shown) used to connect another peripheral circuit region. The line width of each wiring pattern on the connection region 3 changes in two steps, and the change positions of the respective wiring patterns are on an identical line or collinear.

Figure 3:
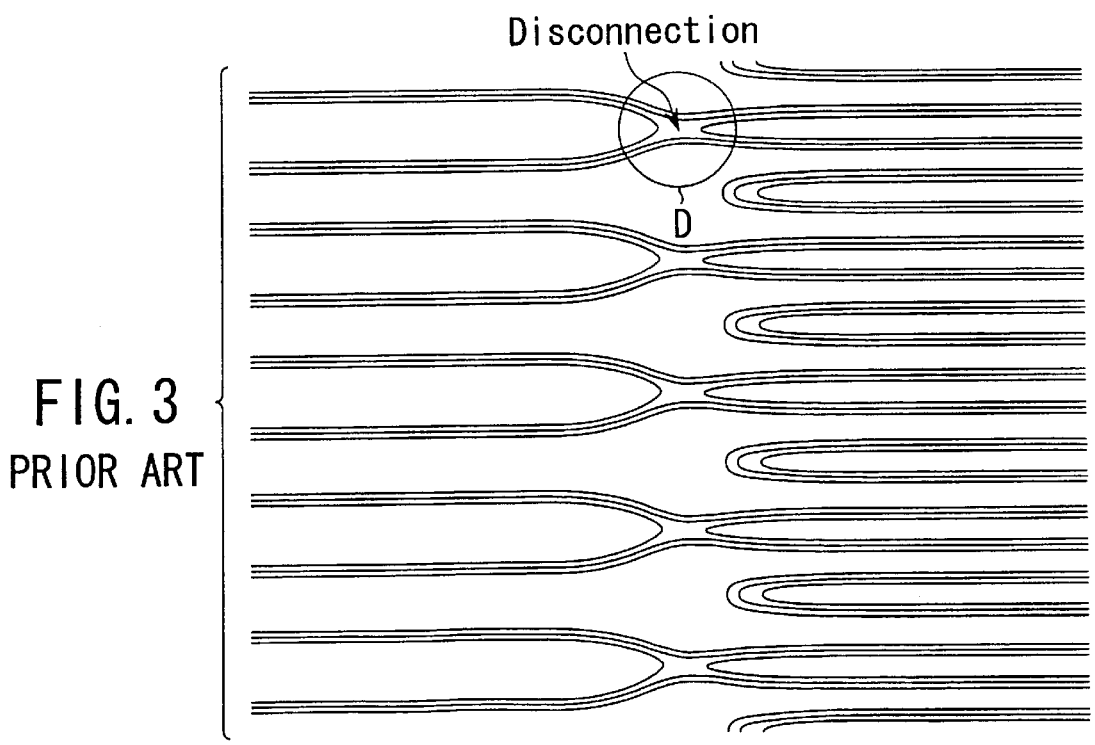
FIG. 3 shows the simulation results of a resist pattern obtained upon exposing a resist on a semiconductor substrate using the pattern exposure mask formed with the wiring patterns shown in FIG. 2.

FIG. 3 shows the simulation results of a resist pattern obtained upon exposing the resist on a semiconductor substrate using the pattern exposure mask shown in FIG. 2. Note that the resist patterns are obtained by computing light intensity distributions, and plotting the distribution of equal intensities. Also, three lines in the resist pattern indicate a resist pattern at a light intensity at which designed wiring dimensions can be obtained, and those at light intensities at which designed wiring dimensions vary ±10%.

As the simulation computation conditions, the line width and line space of wiring lines on a semiconductor substrate are 0.15 μm on the semiconductor substrate, a KrF excimer laser having a wavelength λ=248 nm is used as a light source, the numerical aperture NA=0.6 and coherence factor σ=0.75 are set, and annular illumination that covers the central portion of the light source (covers ⅔ the light source at an area ratio) is used.

Also, as the pattern exposure mask, an attenuated phase shifting mask which has a transmittance of 6% and rotates the phase of light 180° is used. In order to check if an intended depth of focus can be assured, we assumed that exposure is done under the condition with a defocus of 0.4 μm from the best focus position.

However, as can be seen from a simulation result with the smallest line width of the three simulation results shown in FIG. 3, i.e., when the exposure amount has a 10% increase from an optimal value, a wiring line disconnects (indicated within a circle D). That is, wiring lines may disconnect due to variations of the exposure amount, resist sensitivity, and the like in actual exposure, thus causing operation errors. The reason why a desired pattern is not formed at a position where the periodicity of a wiring line is disturbed is that diffracted light produced at the terminal end portion of the wiring line or a position where the line width of the wiring line changes influences neighboring patterns.

The present invention has been made to solve the aforementioned problems, and embodiments of the present invention will be described in detail hereinafter with reference to the accompanying drawings.

First Embodiment

Figure 4:
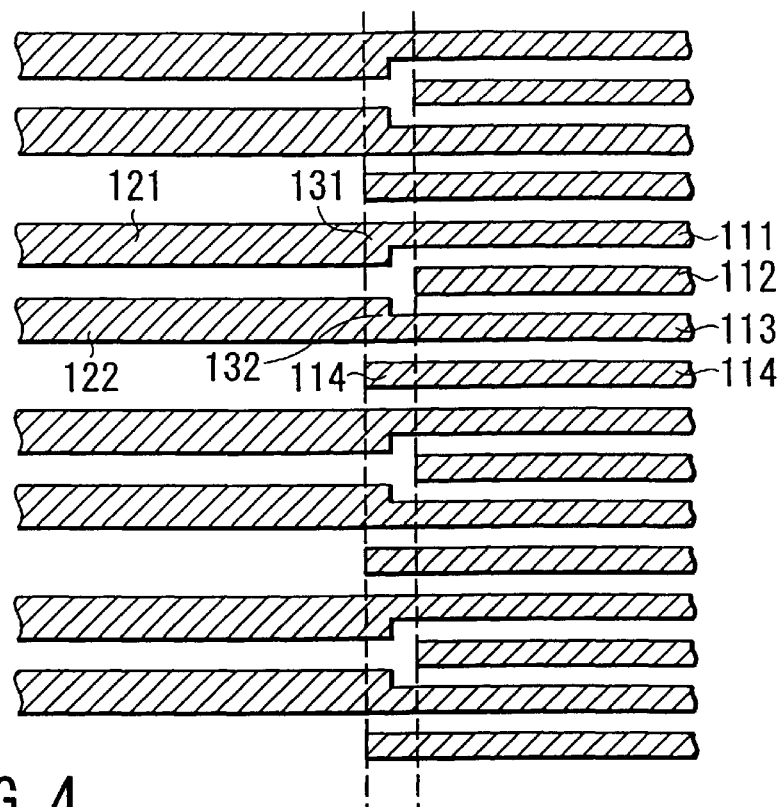
FIG. 4 is a partial plan view of a mask pattern formed on a semiconductor device pattern exposure mask according to the first embodiment of the present invention.
Figure 5:
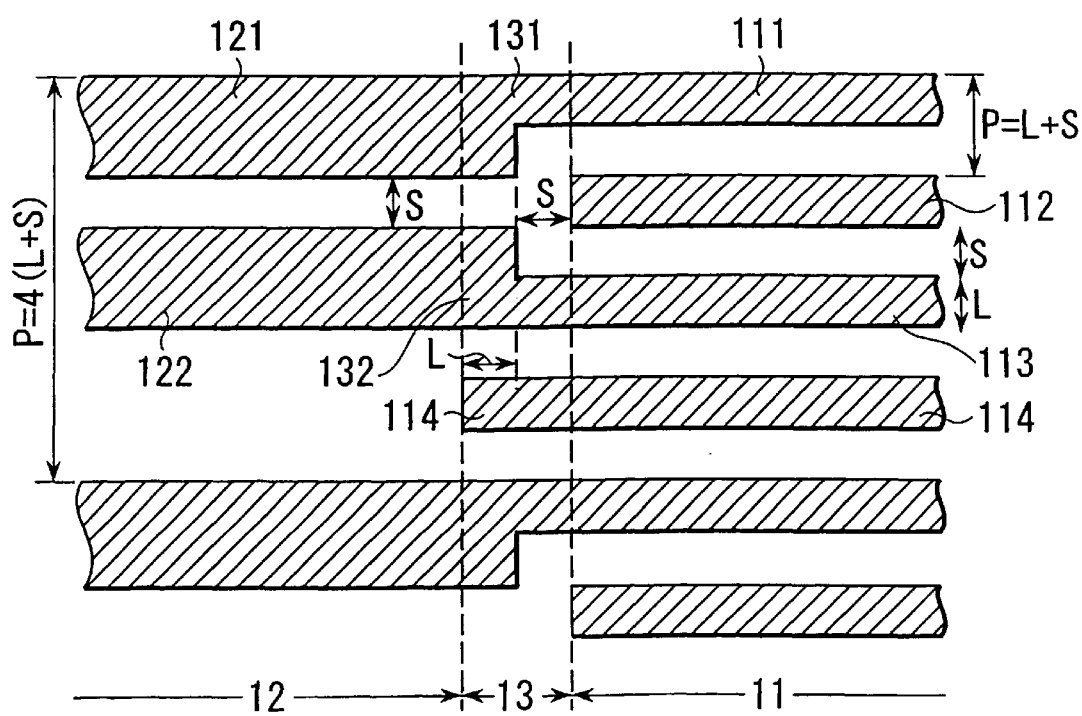
FIG. 5 is a partially enlarged plan view of the mask pattern shown in FIG. 4.

FIG. 4 is a partial plan view of a mask pattern formed on a semiconductor device pattern exposure mask according to the first embodiment of the present invention. FIG. 5 is a partial enlarged view of the mask pattern shown in FIG. 4.

The mask pattern shown in FIGS. 4 and 5 is a pattern exposure mask of a semiconductor memory. Reference numeral 11 denotes a first mask region corresponding to a memory cell array region; 12, a second mask region corresponding to a peripheral circuit region; and 13, a third mask region corresponding to a boundary region (connection region) between the memory cell array region and peripheral circuit region. Also, hatched portions indicate opaque portions (opaque patterns), and blank portions indicate transparent portions. These portions are respectively used to transfer line and space patterns onto a semiconductor substrate.

The first mask region 11 is formed with a first line & space pattern set in which first, second, third, and fourth line patterns 111, 112, 113, and 114 each having a line width L are aligned in turn via line spaces S (wiring pitch=L+S), and at least two sets of these line patterns 111 to 114 repeat themselves periodically.

The second mask region 12 is formed with a second line & space pattern set in which fifth and sixth line patterns 121 and 122 each having a line width L or more are aligned via a line space S or more, and at least two sets of these line patterns 121 and 122 periodically repeat themselves (pitch= 4(L+S)).

One-end portions of the first and third line patterns 111 and 113 of the line patterns 111 to 114 on the first mask region 11 run to be connected to the fifth and sixth line patterns 121 and 122 on the second mask region 12 via seventh and eighth line patterns 131 and 132 on the third mask region 12.

By contrast, the second line pattern 112 of the line patterns 111 to 114 on the first mask region 11 terminates at the boundary position between the first and third mask regions 11 and 13. The fourth line pattern 114 runs to and terminates at the boundary position between the third and second mask regions 13 and 12.

More specifically, the seventh line pattern 131 connected to the first and fifth line patterns 111 and 121, the eighth line pattern 132 connected to the third and sixth line patterns 113 and 122, and the fourth line pattern 114 are aligned on the third mask region 13.

Note that third and second mask regions (not shown) are present at the other end side of the first mask region 11 (on the side opposite to the third mask region) to be symmetric to the third and second mask regions 13 and 12 shown in FIG. 4. The other-end portions of the first and third line patterns 111 and 113 on the first mask region 11 terminate in the third mask region (not shown). The other-end portions of the second and fourth line patterns 112 and 114 on the first mask region 11 run to be connected to line patterns of the second mask region (not shown) via the third mask region (not shown). In this way, all the line patterns 111 to 114 of the first mask region 11 are connected to the second mask regions.

Furthermore, the seventh line pattern 131 is formed so that its line width changes stepwise in the middle of its lengthwise direction in the third mask region 13, and the line width on the side of the fifth line pattern 121 thickens stepwise compared to that on the side of the first line pattern 111. Likewise, the eighth line pattern 132 is formed so that its line width changes stepwise in the middle of its lengthwise direction in the third mask region 13, and the line width on the side of the sixth line pattern 122 thickens stepwise compared to that on the third line pattern 113.

The stepwise change position of the line width of each of the seventh and eighth line patterns 131 and 132 can be separated S or more in the lengthwise direction from the boundary position between the third and first regions 13 and 11, and L or more in the lengthwise direction from the boundary position between the third and second mask regions 13 and 12.

In the first embodiment, the first line pattern 111 runs into the third mask region 13 to a portion of the distance S in the pattern lengthwise direction as a portion of the seventh line pattern 131, while its line width remains the same, and the line width of the seventh line pattern 131 increases at the portion of the distance S. Likewise, the third line pattern 113 runs into the third mask region 13 to a portion of the distance S in the pattern lengthwise direction as a portion of the eighth line pattern 132, while its line width remains the same, and the line width of the eighth line pattern 132 increases at the portion of the distance S.

The fourth line pattern 114 of the first mask region 11 runs parallel to the seventh and eighth line patterns 131 and 132 while its line width L remains the same.

Note that the stepwise change position of the line width of each of the seventh and eighth line patterns 131 and 132 may be separated more than S from the boundary position between the third and first mask regions 13 and 11. However, if this distance is too large, the pattern area increases, and this undesirably results in high cost of a semiconductor device to be manufactured. Hence, it is appropriate to set the distance to this portion to be S.

In the aforementioned mask pattern, the minimum space on the mask is S, and this minimum space S on the mask preferably matches a minimum space S of line & space patterns. The reason for this will be explained below.

In the manufacturing process of a mask, a mask pattern may differ from a desired one due to dust or the like. Hence, after the pattern is formed on the mask, it must be inspected for the presence/absence of defects. Since defect inspection is done by an inspection device using light such as a laser microscope or the like, the size of a pattern that can be inspected is limited by the wavelength of the light source of the inspection device. In order to perfectly execute defect inspection, pattern dimensions must assume large values to some extent.

In a mask used to simultaneously form a memory cell array region and peripheral circuit regions, a pattern having the smallest size in a given mask corresponds to that in a memory cell array region. Therefore, when the wiring line width and wiring spaces of all patterns in the mask are adjusted to those in the memory cell array region, the mask can be perfectly inspected for any defects.

After the gate lines and wiring lines of a semiconductor memory device are formed, pattern portions corresponding to line spaces of the mask are buried by an insulating interlayer later. At this time, if the space between gate lines or wiring lines is too small, the insulating interlayer cannot often be buried in this portion. As a result, foreign matter may remain in this portion, and may cause operation errors of a memory. In this manner, in order to perfectly bury the insulating interlayer, the spaces between gate lines and wiring lines are preferably adjusted to the minimum space of the memory cell array region.

Since photolithography normally uses reduction projection exposure, the dimension of the mask pattern assumes a value four or five times larger than those of a resist pattern formed on a semiconductor substrate. That is, the dimension of a mask used to form a resist pattern of, e.g., 0.15 $\mu$m is 0.6 $\mu$m or 0.75 $\mu$m. In the following description, the dimensions of the mask pattern are equal to those of the resist pattern for the sake of simplicity.

Figure 6:
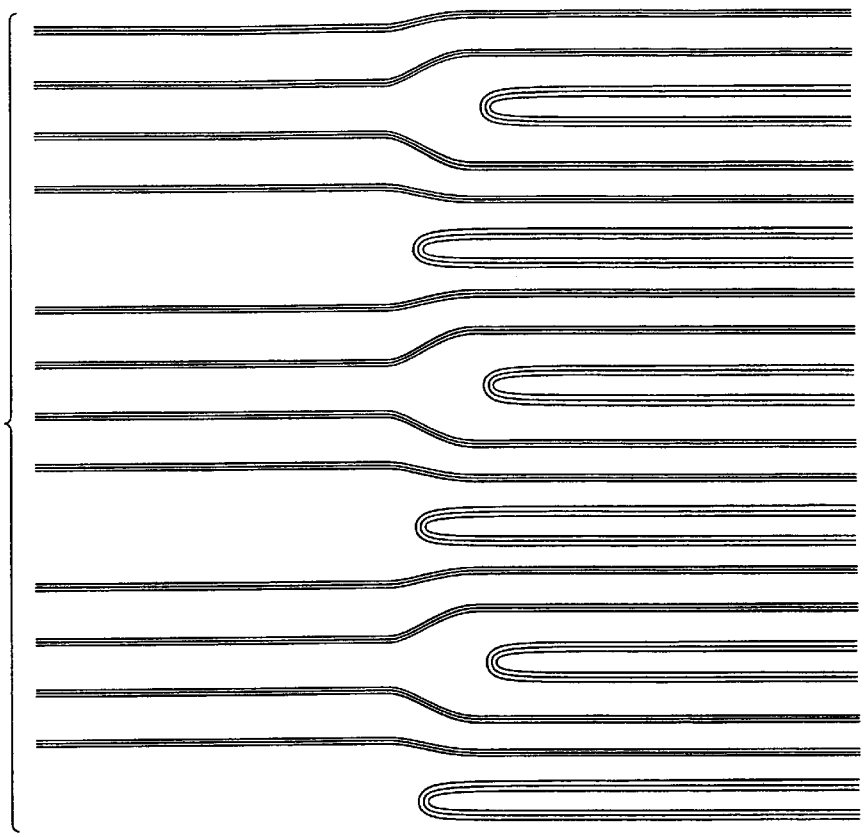
FIG. 6 shows the simulation results of a resist pattern obtained upon exposing a photoresist on a semiconductor device using the mask pattern shown in FIG. 4.

FIG. 6 shows the optical simulation results of a resist pattern obtained by exposing a photoresist on a semiconductor device using the mask pattern shown in FIG. 4.

More specifically, simulation computations are made under the condition that the line width and line space of line patterns corresponding to those of the mask are 0.15 $\mu$m on the semiconductor substrate, a KrF excimer laser having a wavelength $\lambda$=248 nm is used as the light source, the numerical aperture NA=0.6 and coherent factor $\sigma$=0.75 are set, annular illumination that covers the central portion of the light source, and an attenuated phase shifting mask which has a transmittance of 6% and rotates the phase of light 180° is used as the opaque portion.

In actual exposure, steps caused by different stage heights of an exposure system, warp of a semiconductor substrate, and the like, and a defocus caused by steps on a substrate and the like must be taken into consideration, and the computations are made with a defocus of 0.4 $\mu$m.

FIG. 6 shows the distributions of equal intensities obtained by computing the light intensity distributions on the semiconductor substrate by optical simulation under the aforementioned condition. Three lines in FIG. 6 indicate a resist pattern at a light intensity at which designed wiring dimensions (0.15 $\mu$m) can be obtained, and those at light intensities at which designed wiring dimensions vary ±10%.

The resist patterns shown in FIG. 6 are formed in correspondence with the mask pattern shown in FIG. 4, and none of disconnection and short-circuiting of wiring lines, and extremely small line width and space portions are observed. Compared to the conventional resist patterns shown in FIG. 3, since the terminal end portions and line width change portions of the wiring lines are separated by appropriate distances, neighboring wiring patterns are free from any influences of diffracted light produced at those portions. Therefore, when a pattern is actually formed by exposure on a semiconductor substrate using the mask pattern shown in FIG. 4, a sufficiently large process margin can be assured, and a high-quality wiring pattern can be obtained.

A method of forming a wiring pattern by transferring a pattern onto a photoresist on a semiconductor substrate using the mask shown in FIG. 4 will be explained below.

A photoresist is applied on a conductive film (metal or semiconductor film) deposited on a semiconductor substrate, and is exposed to form a pattern by photolithography using the mask shown in FIG. 4. Then, patterning is done by peeling a portion of the exposed photoresist, and removing the exposed portion of the conductive film by etching. In this case, the exposure process may use a normal illumination method but may use off-axis illumination instead. Also, an attenuated phase shifting mask which is prepared by replacing opaque portions of the mask in FIG. 4 by a translucent material that changes a phase may be used.

As a modification of the mask of the first embodiment, a reversal mask in which the opaque and transparent portions of the line & space patterns of the mask according to the first embodiment are reversed may be formed.

A method of forming a wiring pattern by transferring a pattern onto a photoresist on a semiconductor substrate using this reversal mask will be briefly explained below.

A photoresist is applied on an insulating film on a semiconductor substrate, and is exposed to form a pattern by photolithography using the reversal mask. Trenches used to form wiring lines are formed by peeling a portion of the exposed photoresist, and removing exposed portions of the insulating film by etching. After that, a conductor is buried in the trenches used to form wiring lines. In this case, the exposure process may use a normal illumination method but may use off-axis illumination instead. Also, an attenuated phase shifting mask which is prepared by replacing opaque portions of the reversal mask by a translucent material that changes a phase may be used.

Second Embodiment

Figure 7:
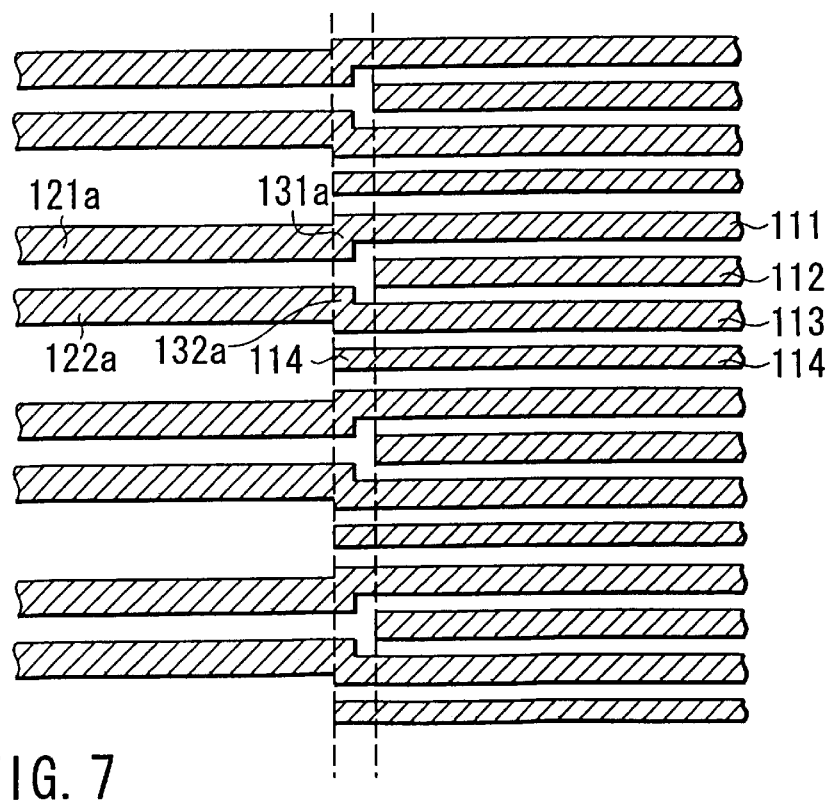
FIG. 7 is a partial plan view of a mask pattern formed on a semiconductor device pattern exposure mask according to the second embodiment of the present invention.
Figure 8:
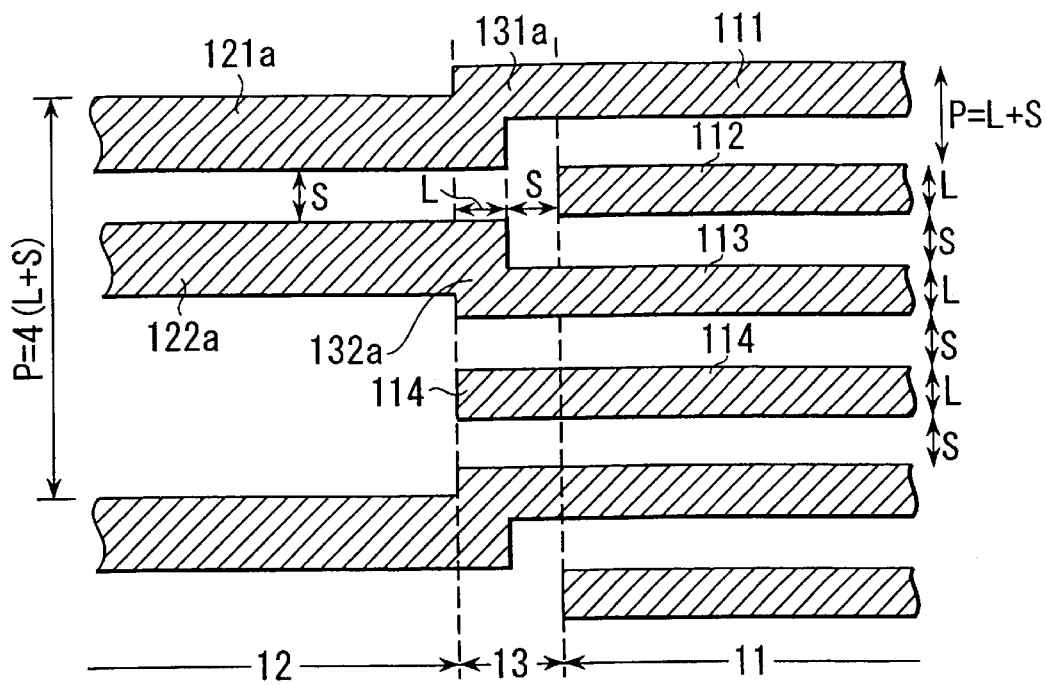
FIG. 8 is a partially enlarged plan view of the mask pattern shown in FIG. 7.

FIG. 7 is a partial plan view of a mask pattern formed on a semiconductor device pattern exposure mask according to the second embodiment of the present invention. FIG. 8 is a partial enlarged view of the mask pattern shown in FIG. 7.

The mask pattern shown in FIGS. 7 and 8 is substantially the same as the mask pattern according to the first embodiment with reference to FIGS. 4 and 5, except that (1) the position of the fifth line pattern 121a is shifted downward in FIGS. 7 and 8 in the second mask region 12, and a seventh line pattern 131a is consequently bent stepwise in the third mask region 13, and (2) the position of the sixth line pattern 122a is shifted upward in FIGS. 7 and 8 (opposite to the shift direction of the fifth line pattern 121a) in the second mask region 12 (the spacing from the fifth line pattern 121a is S or more), and an eighth line pattern 132a is consequently bent stepwise in the third mask region 13. Hence, the same reference numerals in FIGS. 7 and 8 denote the same parts as in FIGS. 4 and 5.

That is, the seventh line pattern 131a is formed so that its line width changes stepwise in the middle of its lengthwise direction in the third mask region 13, and the line width on the side of a fifth line pattern 121a increases stepwise compared to that on the side of the first line pattern 111. Likewise, the eighth line pattern 132a is formed so that its line width changes stepwise in the middle of its lengthwise direction in the third mask region 13, and the line width on the side of a sixth line pattern 122a increases stepwise compared to that on the third line pattern 113.

The seventh and eighth line patterns 131a and 132a are bent toward each other. The line width of the bent wiring portion is L. The line width of this portion may be larger than L, but such large line width is not preferable since it leads to an increase in occupation area. Hence, it is appropriate to set the line width of this portion to be L.

The fourth line pattern 114 having a line width L is formed parallel to the seventh and eighth line patterns 131a and 132a. The line space between the eighth and fourth line patterns 132a and 114 is S in FIGS. 7 and 8, but may be larger than S.

The stepwise bent position of the line width of each of the seventh and eighth line patterns 131a and 132a is separated S or more (S in this embodiment in the lengthwise direction from the boundary position between the third and first mask regions 13 and 11, and L or more (L in this embodiment in the lengthwise direction from the boundary position between the third and second mask regions 13 and 12.

In this embodiment, the seventh and eighth line patterns 131a and 132a are formed so that the first and third line patterns 111 and 113 run into the third mask region 13 to the portion of the distance S in the pattern lengthwise direction while their line widths remain the same, and their line widths increase at that portion.

Note that the stepwise bent position of the line width of each of the seventh and eighth line patterns 131a and 132a may be separated more than S from the boundary position between the third and first mask regions 13 and 11. However, if this distance is too large, the pattern occupation area increases, and this undesirably results in high cost of a semiconductor device to be manufactured. Hence, it is appropriate to set the distance to this portion to be S.

In the aforementioned mask pattern, the minimum space on the mask is S, and this minimum space S on the mask preferably matches a minimum space S of line & space patterns. The reason for this is the same as that explained in the first embodiment.

Figure 9:
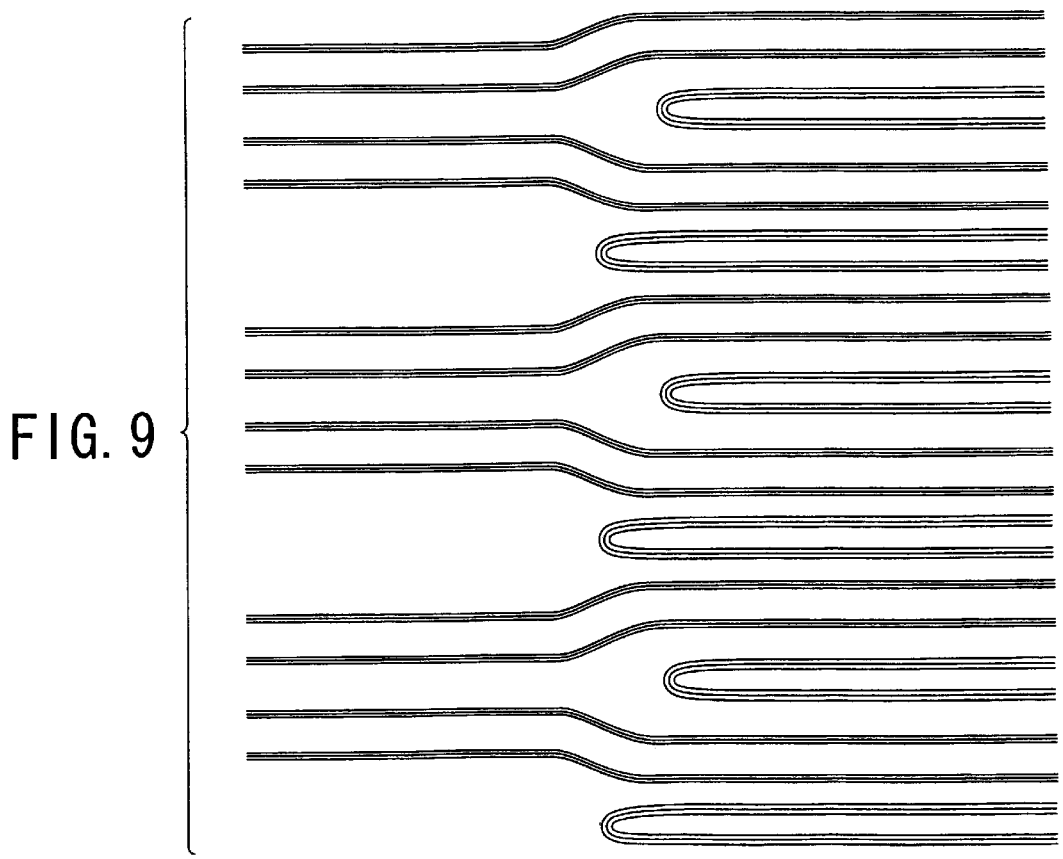
FIG. 9 shows the optical simulation results of a resist pattern obtained upon exposing a photoresist on a semiconductor device using the mask pattern shown in FIG. 7.

FIG. 9 shows the optical simulation results of a resist pattern obtained by exposing a photoresist on a semiconductor device using the mask pattern shown in FIG. 7. Upon simulation, the conditions of a light source and the like are the same as those in the first embodiment.

The resist patterns shown in FIG. 9 are formed in correspondence with the mask pattern shown in FIG. 7, and none of disconnection and short-circuiting of wiring lines, and extremely small line width and space portions are observed. Therefore, when a pattern is actually formed by exposure on a semiconductor substrate, a sufficiently large process margin can be assured, and a high-quality wiring pattern can be obtained.

Note that the method of manufacturing a semiconductor device according to the second embodiment can be practiced according to the first embodiment mentioned above, and a semiconductor device may be manufactured using a reversal mask of the mask pattern shown in FIG. 7.

Third Embodiment

Figure 10:
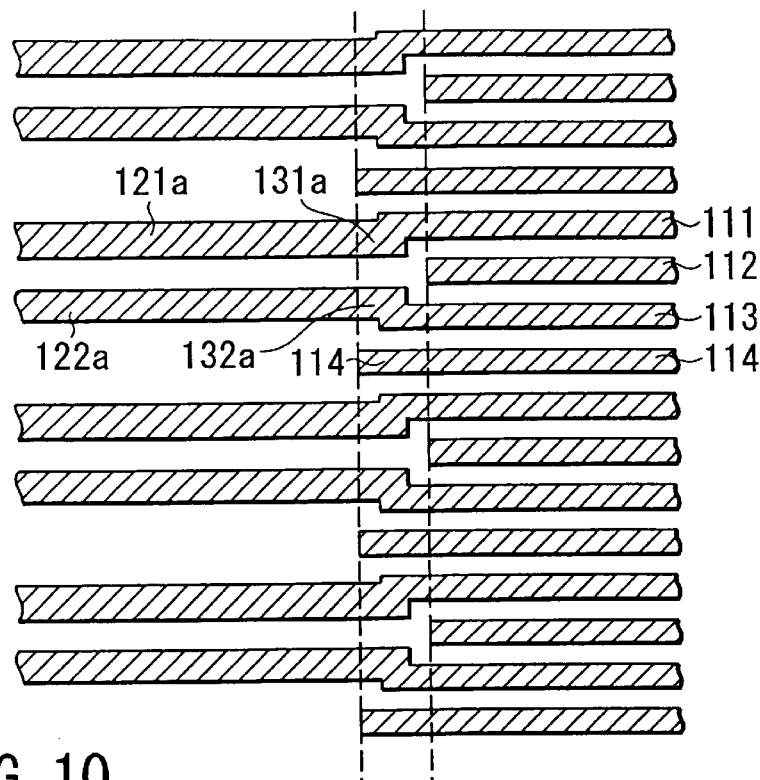
FIG. 10 is a partial plan view of a mask pattern formed on a semiconductor device pattern exposure mask according to the third embodiment of the present invention.
Figure 11:
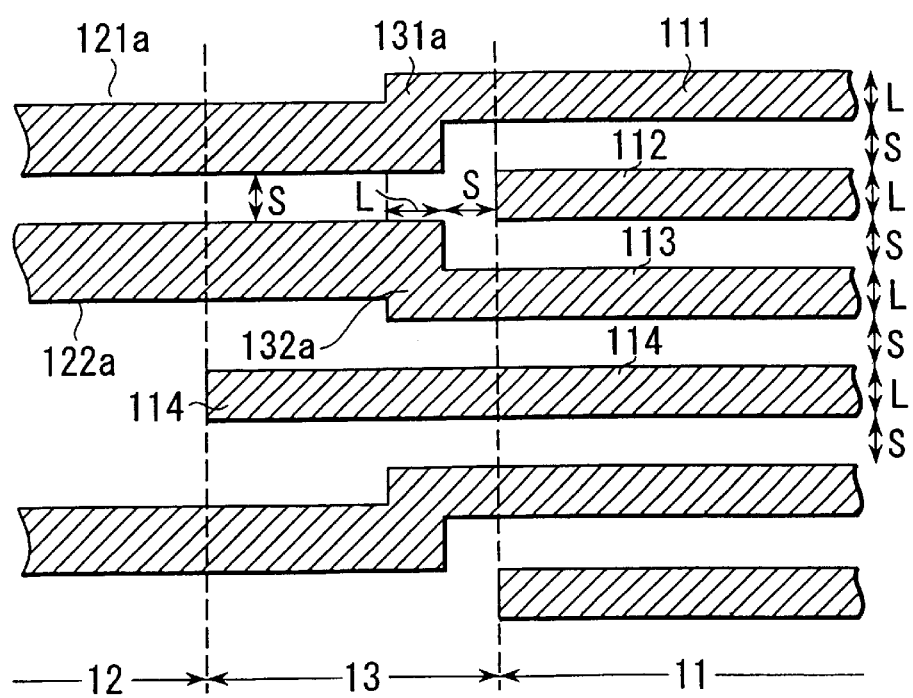
FIG. 11 is a partially enlarged plan view of the mask pattern shown in FIG. 10.

FIG. 10 is a partial plan view of a mask pattern formed on a semiconductor device pattern exposure mask according to the third embodiment of the present invention. FIG. 11 is a partial enlarged view of the mask pattern shown in FIG. 10.

The mask pattern shown in FIGS. 10 and 11 is substantially the same as the mask pattern of the second embodiment described with reference to FIGS. 7 and 8, except that the terminal position of the fourth line pattern 114 is closer to the second region 12 than the bent portion of the seventh or eighth line pattern 131a or 132a. Hence, the same reference numerals in FIGS. 10 and 11 denote the same parts as in FIGS. 4 and 5.

In other words, the fourth line pattern 114 terminates at the boundary position between the third and second regions 13 and 12, the one-end (side) portions of the seventh and eighth line patterns 131a and 132a in the line widthwise direction are bent stepwise at a position separated L or more from that boundary position in the line direction inside the third region, and the other-end (side) portions of the seventh and eighth line patterns 131a and 132a in the line widthwise direction are bent stepwise at a position further separated L from that bent positions in the lengthwise direction.

Figure 12:
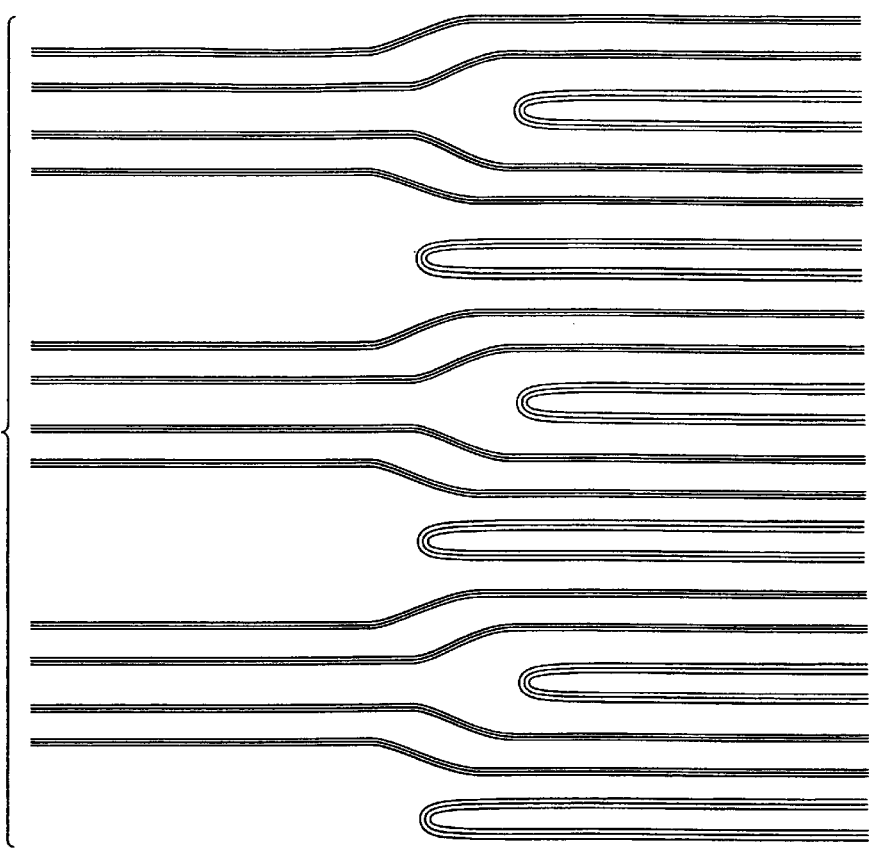
FIG. 12 shows the optical simulation results of a resist pattern obtained upon exposing a photoresist on a semiconductor device using the mask pattern shown in FIG. 10.

FIG. 12 shows the optical simulation results of a resist pattern obtained by exposing a photoresist on a semiconductor device using the mask pattern shown in FIG. 10. Upon simulation, the conditions of a light source and the like are the same as those in the first embodiment.

The resist patterns shown in FIG. 12 are formed in correspondence with the mask pattern shown in FIG. 10, and none of disconnection and short-circuiting of wiring lines, and extremely small line width and space portions are observed. Therefore, when a pattern is actually formed by exposure on a semiconductor substrate, a sufficiently large process margin can be assured, and a high-quality wiring pattern can be obtained.

In addition, when the mask shown in FIG. 10 is used, coherence between diffracted light produced near the terminal end portion of the fourth line pattern 114 and diffracted light produced near the bent portions of the seventh and eighth line patterns 131a and 132a of the mask can be reduced compared to the mask of the second embodiment shown in FIG. 7, and the effect of preventing disconnection and short-circuiting of wiring lines can be further improved.

Note that the method of manufacturing a semiconductor device according to the third embodiment can be practiced according to the first embodiment mentioned above, and a semiconductor device may be manufactured using a reversal mask of the mask pattern shown in FIG. 10.

Fourth Embodiment

Figure 13:
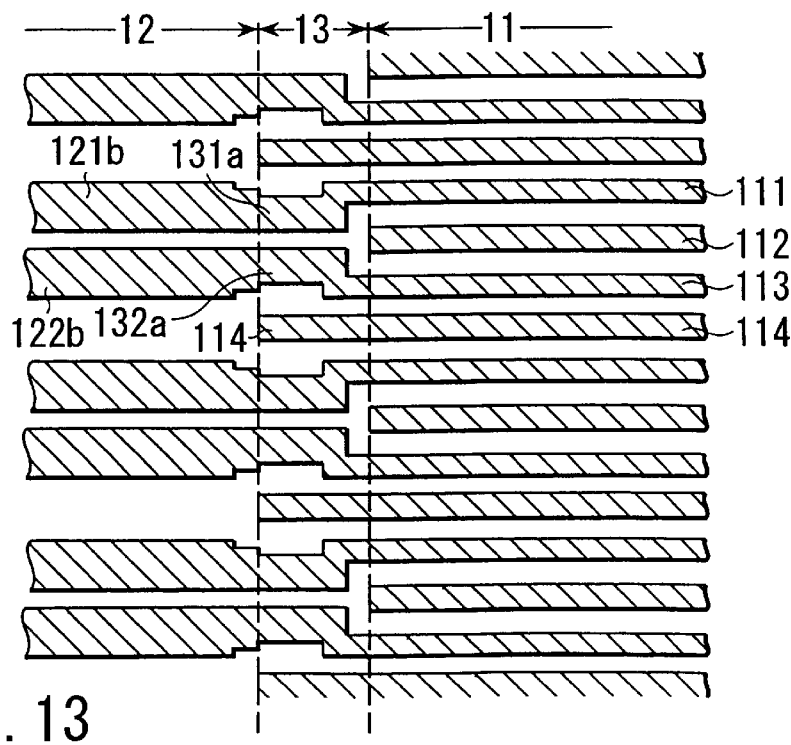
FIG. 13 is a partial plan view of a mask pattern formed on a semiconductor device pattern exposure mask according to the fourth embodiment of the present invention.

FIG. 13 is a partial plan view of a mask pattern formed on a semiconductor device pattern exposure mask according to the fourth embodiment of the present invention.

The mask pattern shown in FIG. 13 is substantially the same as the mask pattern according to the third embodiment described above with reference to FIGS. 10 and 11, except that the line widths of fifth and sixth line patterns 121b and 122b in the second region 12 change stepwise at the boundary position between the third and second regions 13 and 12, and its neighboring position, and the fifth and sixth line patterns 121b and 122b thicken stepwise toward each other. Hence, the same reference numerals in FIG. 13 denote the same parts as in FIGS. 4 and 5.

In other words, stepwise auxiliary patterns are added to the one-side-end portions (two opposite end sides) of the fifth and sixth line patterns 121b and 122b in the line widthwise direction.

Figure 14:
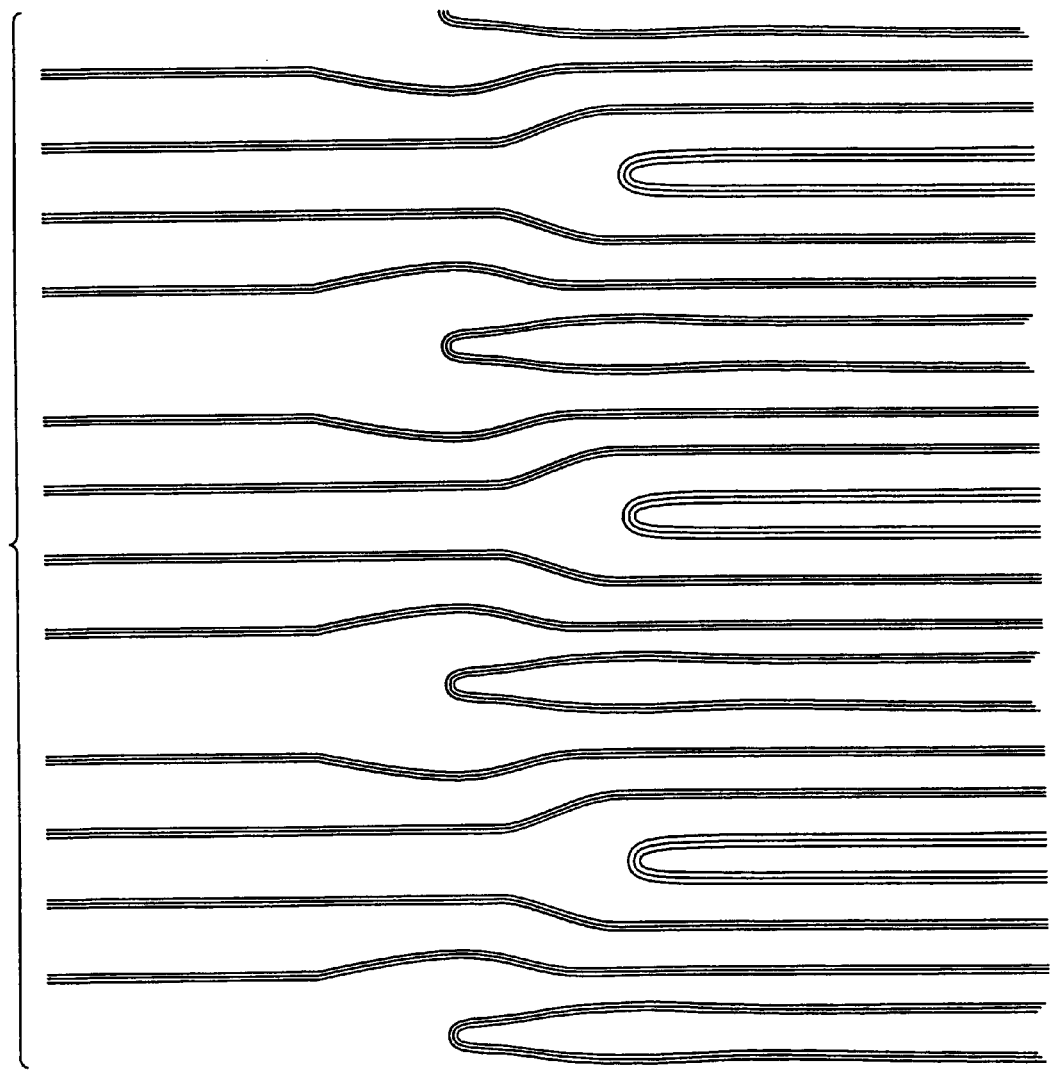
FIG. 14 shows the optical simulation results of a resist pattern obtained upon exposing a photoresist on a semiconductor device using the mask pattern shown in FIG. 13.

FIG. 14 shows the optical simulation results of a resist pattern obtained by exposing a photoresist on a semiconductor device using the mask pattern shown in FIG. 13. Upon simulation, the conditions of a light source and the like are the same as those in the first embodiment.

The resist patterns shown in FIG. 14 are formed in correspondence with the mask pattern shown in FIG. 13, and none of disconnection and short-circuiting of wiring lines, and extremely small line width and space portions are observed. Therefore, when a pattern is actually formed by exposure on a semiconductor substrate, a sufficiently large process margin can be assured, and a high-quality wiring pattern can be obtained.

In addition, when the mask shown in FIG. 13 is used, the line widths of the fifth and sixth line patterns 121b and 122b in the second region 12 increase stepwise at the boundary position between the third and second regions 13 and 12 and its neighboring position, and coherence between diffracted light produced near those stepwise portions and diffracted light produced near the terminal end portion of the fourth line pattern 114 can be reduced compared to the mask of the third embodiment shown in FIG. 10, thus further improving the effect of preventing disconnection and short-circuiting of wiring lines.

Note that the method of manufacturing a semiconductor device according to the fourth embodiment can be practiced according to the first embodiment mentioned above, and a semiconductor device may be manufactured using a reversal mask of the mask pattern shown in FIG. 13.

The features of the semiconductor device patterns according to the first to fourth embodiments will be summarized below. That is, the semiconductor device pattern comprises (a) a first line & space pattern set in which first, second, third, and fourth line patterns, each of which has a line width L and is made of a conductor, are formed to be aligned in turn via line spaces S on at least a first region on a semiconductor substrate, (b) a second line & space pattern set in which fifth and sixths line patterns, each of which has a line width L or more and is made of a conductor, are formed to be aligned in turn via line spaces S or more on at least a second region on the semiconductor substrate, and (c) a third line & space pattern set in which a seventh line pattern, which is connected to the first and fifth line patterns and is made of a conductor, and an eighth line pattern which is connected to the third and sixth line patterns and is made of a conductor, are formed on a third region present between the first and second regions on the semiconductor substrate. Furthermore, (d) the second line pattern terminates at the boundary position between the first and third regions, and the fourth line pattern terminates at the boundary position between the third and second regions, (e) the seventh line pattern is formed so that its line width changes stepwise in the middle of the lengthwise direction in the third region, and the line width on the fifth line pattern side thickens stepwise compared to that on the first line pattern side, (f) the eighth line pattern is formed so that its line width changes stepwise in the middle of the lengthwise direction in the third region, and the line width on the sixth line pattern side thickens stepwise compared to that on the third line pattern side, and (g) at least two sets of first to third line & space patterns periodically repeat themselves on the corresponding regions.

In the first to fourth embodiments, the first line & space pattern on the first region 11 of the mask is formed so that line patterns having a line width L or more are aligned in turn via line spaces S, and the second line & space pattern on the second region 12 of the mask is formed so that line patterns having a line width L or more are aligned in turn via line spaces S.

As a modification of the first to fourth embodiments, the first line & space pattern may be formed so that line patterns are aligned in turn at a pitch P, and the second line & space pattern may be formed so that line patterns are aligned in turn at a pitch more than P, thus obtaining substantially the same effect as in the first to fourth embodiments.

A semiconductor device may be manufactured using a reversal mask of the mask pattern according to this modification.

Fifth Embodiment

A mask according to the fifth embodiment is a pattern exposure mask of a NAND flash memory as a kind of EEPROM.

The NAND flash memory will be briefly explained below. An EEPROM as a kind of nonvolatile semiconductor memory device normally uses a memory cell (EEPROM cell) having a MOS structure in which floating and control gates are stacked, and is electrically programmable. The NAND flash memory has a NAND cell array obtained by connecting a plurality of EEPROM cells in series with each other, and is suitable for high integration.

Figures 15, 16:
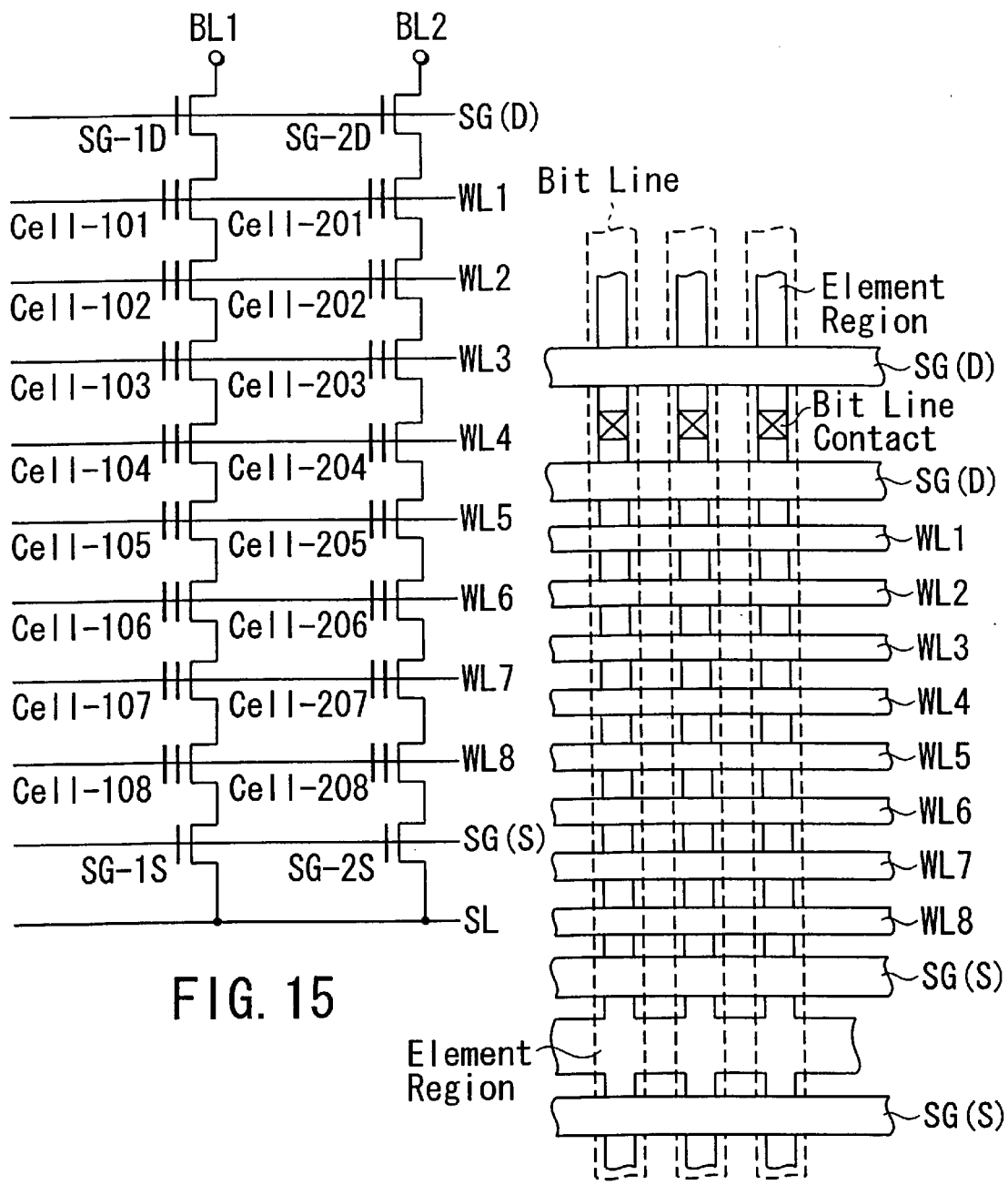
FIG. 15 is an equivalent circuit diagram showing two blocks in the word line direction of a memory cell array of a NAND flash memory so as to explain the fifth embodiment of the present invention.
FIG. 16 is a plan view of a pattern for three blocks in the word line direction of the memory cell array of the NAND flash memory shown in FIG. 15.

FIG. 15 shows an equivalent circuit of two blocks aligned in the word line direction in a memory cell array of a NAND flash memory.

Eight EEPROM cells 101 to 108 (201 to 208) are connected in series with each other to form a NAND cell. The drain of the NAND cell is connected to a bit line BL1 (BL2) via a drain-side select transistor SG-1D (SG-2D), and its source is connected to a source line SL via a source-side select transistor SG-1S (SG-2S).

A plurality of blocks each having a combination of one drain-side select transistor, one NAND cell, and one source-side select transistor form a memory cell array. Note that the number of EEPROM cells that form each NAND cell is not limited to eight, and any other numbers of cells (4, 16, 32, and the like) may be used.

Figure 17:
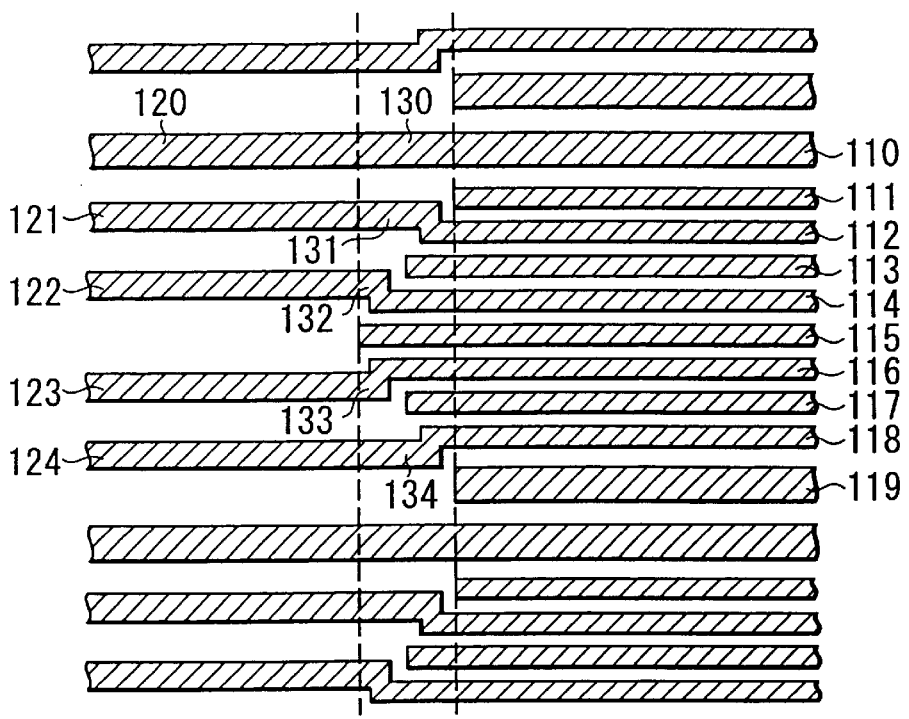
FIG. 17 is a partial plan view of a mask pattern formed on a semiconductor device pattern exposure mask according to the fifth embodiment of the present invention.

FIG. 17 is a plan view of a pattern for three blocks which are aligned in the word line direction in the memory cell array of the NAND flash memory.

The control gate electrode of each NAND cell is connected to word lines WL1 to WL8, which are commonly connected to the control gate electrodes of neighboring NAND cells. The gate electrodes of the neighboring drain-side select transistors SG-1D and SG-2D are commonly connected to a drain-side select gate line SG(D), and the gate electrodes of the neighboring source-side select transistors SG-1S and SG-2S are commonly connected to a source-side select gate line SG(S).

Figure 18:
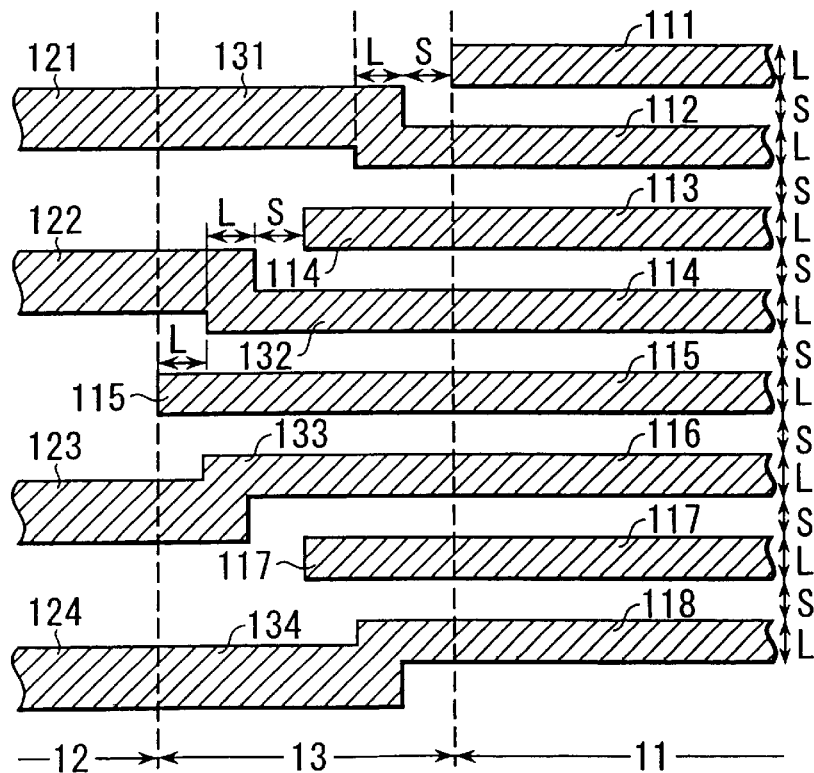
FIG. 18 is a partially enlarged plan view of the mask pattern shown in FIG. 17.

FIG. 17 is a partial plan view of a mask pattern formed on a semiconductor device pattern exposure mask according to the fifth embodiment of the present invention. FIG. 18 is a partial enlarged view of the mask pattern shown in FIG. 17.

In the mask pattern shown in FIGS. 17 and 18, reference numeral 11 denotes a first mask region corresponding to a memory cell array region of the NAND flash memory; 12, a second mask region corresponding to a peripheral circuit region; and 13, a third mask region corresponding to the boundary region (connection region) between the memory cell array region and peripheral circuit region. Also, hatched portions indicate opaque portions (opaque patterns), and blank portions indicate transparent portions. These portions are respectively used to transfer line and space patterns onto a semiconductor substrate.

The first mask region 11 is formed with a first line & space pattern set in which first to eighth line patterns 111 to 118 each having a line width L are aligned in turn via line spaces S (wiring pitch=L+S), and at least two sets of these line patterns 111 to 118 repeat themselves periodically. In this case, the line patterns 111 to 118 correspond to the eight word lines WL1 to WL8 of the NAND cell, and line patterns 110 and 119 corresponding to the drain- and source-side select gate lines SG(D) and SG(S) are formed between neighboring sets of line patterns 111 to 118. One end of the line pattern 110 corresponding to the drain-side select gate line runs while its line width remains the same, and is connected to a line pattern 120 in the second mask region 12 via the third mask region 13.

The second mask region 12 is formed with a second line & space pattern set in which ninth to 12th line patterns 121 to 124 each having a line width L or more are aligned in turn via line spaces S or more (wiring pitch=2×(L+S)), and at least two sets of these line patterns 121 to 124 repeat themselves periodically. In this case, the line pattern 120 corresponding to the drain-side select gate line is formed between neighboring sets of line patterns 121 to 124.

Of the line patterns 111 to 118 in the first mask region 11, for example, the one-end portions of even line patterns, i.e., the second, fourth, sixth, and eighth line patterns 112, 114, 116, and 118 run to be connected to the line patterns 121 to 124 in the second mask region 12 via the third mask region 13.

By contrast, the one-end portions of the remaining odd line patterns, i.e., the first, third, fifth, and seventh line patterns 111, 113, 115, and 117 in the first mask region 11 terminate in the third mask region 13. In this case, the first line pattern 111 terminates at the boundary position between the first and third mask regions 11 and 13, the third and seventh line patterns 113 and 117 run while their line widths remain the same, and terminate at the middle position of the third mask region 13, and the fifth line pattern 115 runs to the boundary position between the third and second mask regions 13 and 12 while its line width remains the same and terminates at that position.

In other words, the four line patterns (first, third, fifth, and seventh line patterns 111, 113, 115, and 117), which are not connected to the second line & space pattern, of the first line & space pattern terminate at any of the boundary position between the first and third regions 11 and 13, the boundary position between the third and second regions 13 and 12, and the middle position in the third region 13, and the terminal positions of those line patterns located near the center of the first line & space pattern layout are closer to the second region 12.

More specifically, the third mask region 13 is formed with a third line & space pattern in which a 13th line pattern 131 connected to the second and ninth line patterns 112 and 121, a 14th line pattern 132 connected to the fourth and 10th line patterns 113 and 122, a 15th line pattern 113 connected to the sixth and 11th line patterns 116 and 123, and a 16th line pattern 134 connected to the eighth and 12th line patterns 118 and 124, and at least two sets of line patterns 131 to 134 periodically repeat themselves. In this case, the third, fifth, and seventh line patterns 113, 115, and 117 in the first mask region 11 run into the third mask region 13, and the line patterns are aligned in the third mask region 13 in the order of 131, 113, 132, 115, 133, 117, and 134. Furthermore, a line pattern 130 corresponding to the drain-side select gate line is arranged between neighboring sets of line patterns 131 to 134.

The line patterns 131 to 134 are formed so that their line widths change stepwise and these line patterns are bent stepwise in the middle of the lengthwise direction in the third region 13, and the line widths on the second line & space pattern side thicken stepwise compared to those on the first line & space pattern side. In addition, the stepwise change positions of the line widths become closer to the second region 12 as the line patterns are located near the center of the third line & space pattern layout.

In this case, the 13th line pattern 131 is bent in a direction to approach the first line pattern 111, the length of the bent portion is L or more (it is appropriate to select L in terms of suppression of the pattern occupation area), and the stepwise change position of one end in its line widthwise direction is separated S or more (it is appropriate to select S in terms of suppression of the pattern occupation area) from the terminal position of the first line pattern 111 in the lengthwise direction.

The terminal position of the third line pattern 113 is separated S or more (it is appropriate to select S in terms of suppression of the pattern occupation area) from the stepwise change position of the other end of the 13th line pattern 131 in the line widthwise direction.

The 14th line pattern 132 is bent in a direction to approach the third line pattern 113, the length of the bent portion is L or more (it is appropriate to select L in terms of suppression of the pattern occupation area), and the stepwise change position of one end in its line widthwise direction is separated S or more (it is appropriate to select S in terms of suppression of the pattern occupation area) from the terminal position of the third line pattern 113 in the lengthwise direction.

The terminal position of the fifth line pattern 115 is separated S or more (it is appropriate to select S in terms of suppression of the pattern occupation area) from the stepwise change position of the other end of the 14th line pattern 132 in the line widthwise direction.

The 15th line pattern 133 is bent in a direction to approach the seventh line pattern 117, the length of the bent portion is L or more (it is appropriate to select L in terms of suppression of the pattern occupation area), and the stepwise change position of one end in its line widthwise direction is separated S or more (it is appropriate to select S in terms of suppression of the pattern occupation area) from the terminal position of the third line pattern 113 in the lengthwise direction. That is, the 15th and 14th line patterns 133 and 132 are bent at collinear positions.

The terminal position of the seventh line pattern 117 is separated S or more (it is appropriate to select S in terms of suppression of the pattern occupation area) from the stepwise change position of the other end of the 13th line pattern 131 in the line widthwise direction. That is, the seventh and third line patterns 117 and 113 terminate at collinear positions.

The 16th line pattern 134 is bent in a direction away from the seventh line pattern 117, the stepwise change position of one end in its line widthwise direction is separated S or more (it is appropriate to select S in terms of suppression of the pattern occupation area) from the terminal position of the first line pattern 111 in the lengthwise direction, and the length of the bent portion is L or more (it is appropriate to select L in terms of suppression of the pattern occupation area). That is, the 16th and 13th line patterns 134 and 131 are bent at collinear positions.

In the aforementioned mask pattern, the minimum space on the mask is S, and this minimum space S on the mask preferably matches a minimum space S of line & space patterns. The reason for this is as has been explained in the first embodiment.

Note that third and second mask regions (not shown) are present at the other end side of the first mask region 11 (on the side opposite to the third region 13) to be symmetric to the third and second mask regions 13 and 12 shown in FIG. 17. The other-end portions of the second, fourth, sixth, and eighth line patterns 112, 114, 116, and 118 in the first mask region 11 terminate in the third mask region (13: not shown).

Also, the other-end portions of the first, third, fifth, and seventh line patterns 111, 113, 115, and 117 in the first mask region 11 run to be connected to line patterns of the second mask region 12 (not shown) via the third mask region 13 (not shown). In this way, all the line patterns of the first mask region 11 are connected to the second mask regions.

Figure 19:
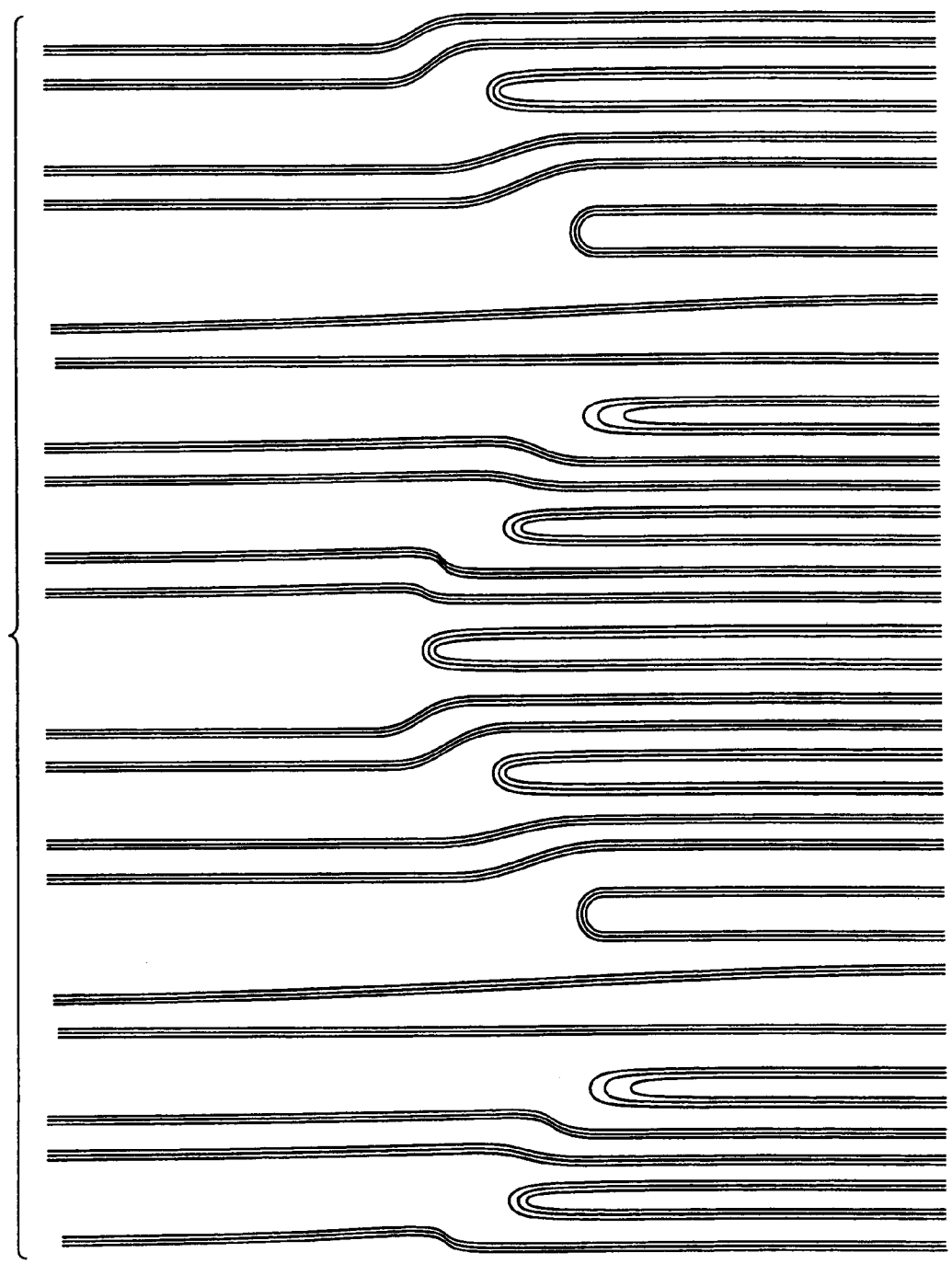
FIG. 19 shows the optical simulation results of a resist pattern obtained upon exposing a photoresist on a NAND flash memory using the mask pattern shown in FIG. 17.

FIG. 19 shows the optical simulation results of a resist pattern obtained by exposing a photoresist on a NAND flash memory using the mask pattern shown in FIG. 17. Upon simulation, the conditions of a light source and the like are the same as those in the first embodiment.

The resist patterns shown in FIG. 19 are formed in correspondence with the mask pattern shown in FIG. 17, and none of disconnection and short-circuiting of wiring lines, and extremely small line width and space portions are observed. Therefore, when a pattern is actually formed by exposure on a semiconductor substrate, a sufficiently large process margin can be assured, and a high-quality wiring pattern can be obtained.

Note that the method of manufacturing a semiconductor device according to the fifth embodiment can be practiced according to the first embodiment mentioned above, and a semiconductor device may be manufactured using a reversal mask of the mask pattern shown in FIG. 17.

Sixth Embodiment

Figure 20:
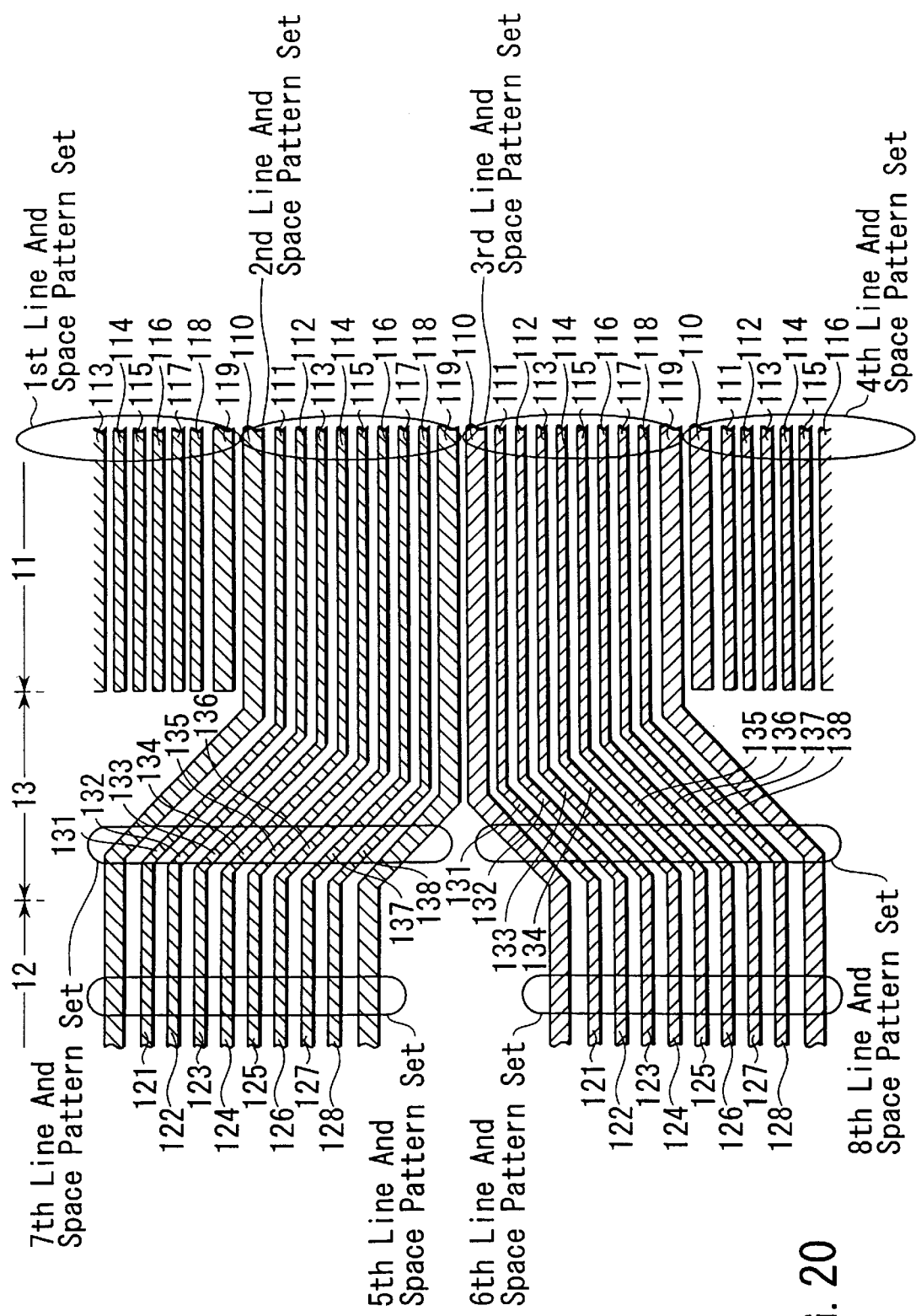
FIG. 20 is a partial plan view of a mask pattern formed on a semiconductor device pattern exposure mask according to the sixth embodiment of the present invention.

FIG. 20 is a partial plan view of a mask pattern formed on a semiconductor device pattern exposure mask according to the sixth embodiment of the present invention.

The mask pattern shown in FIG. 20 is a pattern exposure mask of a NAND flash memory, and reference numeral 11 denotes a first mask region corresponding to a memory cell array region of the NAND flash memory; 12, a second mask region corresponding to a peripheral circuit region; and 13, a third mask region corresponding to a boundary region (connection region) between the memory cell array region and peripheral circuit region.

A memory cell array of the NAND flash memory is formed by a plurality of blocks each having a combination of a drain-side select transistor SG-1D, a NAND cell as a series circuit of eight EEPROM cells 101 to 108, and a source-side select transistor SG-1S, as has been described above with reference to the equivalent circuit shown in FIG. 15. FIG. 20 shows a region corresponding to four blocks in the bit line direction.

The first mask region 11 includes at least four (first, second, third, and fourth) line & space pattern sets in each of which eight line patterns 111 to 118 which are formed of opaque members to form the word lines WL1 to WL8 of the NAND cells of first, second, third, and fourth blocks of the memory cell array region are aligned in turn at a pitch P1 via line spaces S.

The second mask region 12 includes fifth and sixth line & space pattern sets in which eight line patterns 121 to 128 formed of opaque members repeat themselves at a pitch of P2 larger than P1 line spaces.

The third mask region 13 includes seventh and eighth line & space pattern sets. In the seventh line & space pattern set, eight line patterns 131 to 138 which are formed of opaque members and are respectively connected to the eight line patterns 111 to 118 in the second line & space pattern set in the first region 11 and eight line patterns 121 to 128 in the fifth line & space pattern set in the second mask region 12 are formed via line spaces. In the eighth line & space pattern set, eight line patterns 131 to 138 which are formed of opaque members and are respectively connected to the eight line patterns 111 to 118 in the third line & space pattern set and the eight line patterns 121 to 128 in the sixth line & space pattern set are formed via line spaces.

The line patterns 111 to 118 in the first and fourth line & space pattern sets in the first mask region 11 terminate at the boundary position between the first and third regions 11 and 13.

Some of the line patterns 131 to 138 in the seventh and eighth line & space pattern sets in the third mask region 13 run obliquely with respect to the lengthwise direction of the patterns in the first mask region 11, and a pitch P3 of the oblique patterns is larger than the pitch P1 of the line patterns 111 to 118 in the first mask region 11 and is smaller than the pitch P2 of the line patterns 121 to 128 in the second mask region 12. That is, P1<P3<P2.

The first, second, third, and fourth line & space pattern sets periodically repeat themselves at least twice on the first mask region 11, the fifth and sixth line & space pattern sets periodically repeat themselves at least twice on the second mask region 12, and the seventh and eighth line & space pattern sets periodically repeat themselves at least twice on the third mask region 13.

Note that third and second mask regions (not shown) are present at the other end side of the first mask region 11 (on the side opposite to the third mask region) to be symmetric to the third and second mask regions 13 and 12 shown in FIG. 20. The other-end portions of the line patterns 111 to 118 in the second and third line & space pattern sets on the first mask region 11 terminate in the third mask region (not shown). The other-end portions of the line patterns 111 to 118 (the gate lines of the memory cells in the first and fourth blocks) in the first and fourth line & space pattern sets run to be connected to the line patterns of the second mask region (not shown) via the third mask region (not shown). In this manner, all the line patterns 111 to 118 in the first mask region 11 are connected to the second mask regions.

In FIG. 20, reference numeral 110 denotes a line pattern corresponding to the drain-side select gate line SG(D) of each NAND cell block; and 119, a line pattern corresponding to the source-side select gate line SG(S).

Figure 21:
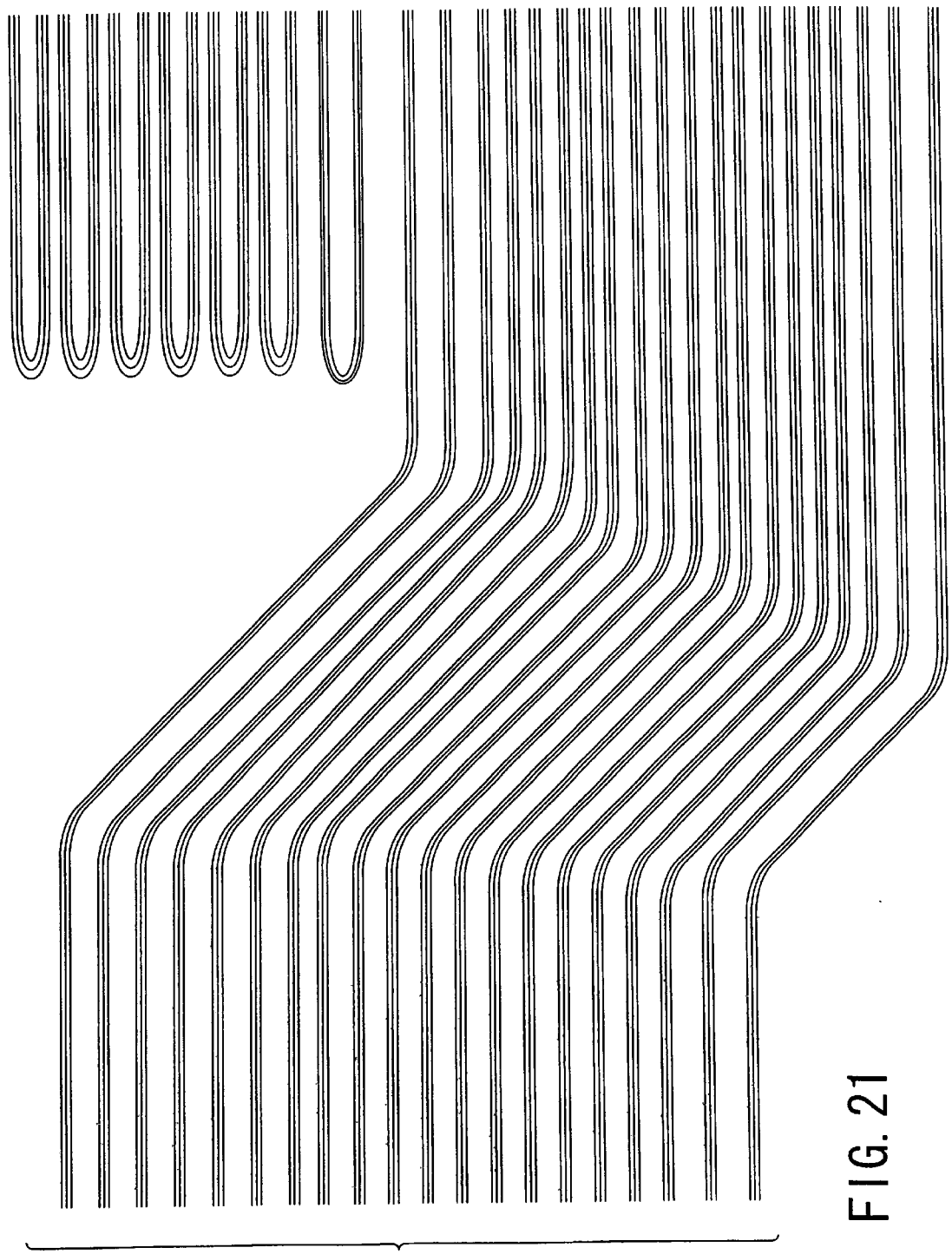
FIG. 21 shows the optical simulation results of a resist pattern obtained upon exposing a photoresist on a NAND flash memory using the mask pattern shown in FIG. 20.

FIG. 21 shows the optical simulation results of a resist pattern obtained by exposing a photoresist on a NAND flash memory using the mask pattern shown in FIG. 20. Upon simulation, the conditions of a light source and the like are the same as those in the first embodiment.

The resist patterns shown in FIG. 21 are formed in correspondence with the mask pattern shown in FIG. 20, and none of disconnection and short-circuiting of wiring lines, and extremely small line width and space portions are observed. Therefore, when a pattern is actually formed by exposure on a semiconductor substrate, a sufficiently large process margin can be assured, and a high-quality wiring pattern can be obtained.

Note that the method of manufacturing a semiconductor device according to the sixth embodiment can be practiced according to the first embodiment mentioned above, and a semiconductor device may be manufactured using a reversal mask of the mask pattern shown in FIG. 20.

As described above, the first to sixth embodiments can provide a semiconductor device, its manufacturing method, and a semiconductor device pattern exposure mask, which can suppress the resolution and depth of focus from impairing upon forming very fine wiring patterns on the connection region between regions with different wiring pitches using photolithography, can eliminate disconnection and short-circuiting of wiring patterns, and can achieve high integration.

Problems posed when patterns at the memory cell array edge portion suffer larger dimensional variations than internal patterns will be discussed below.

Figures 22A, 22B:
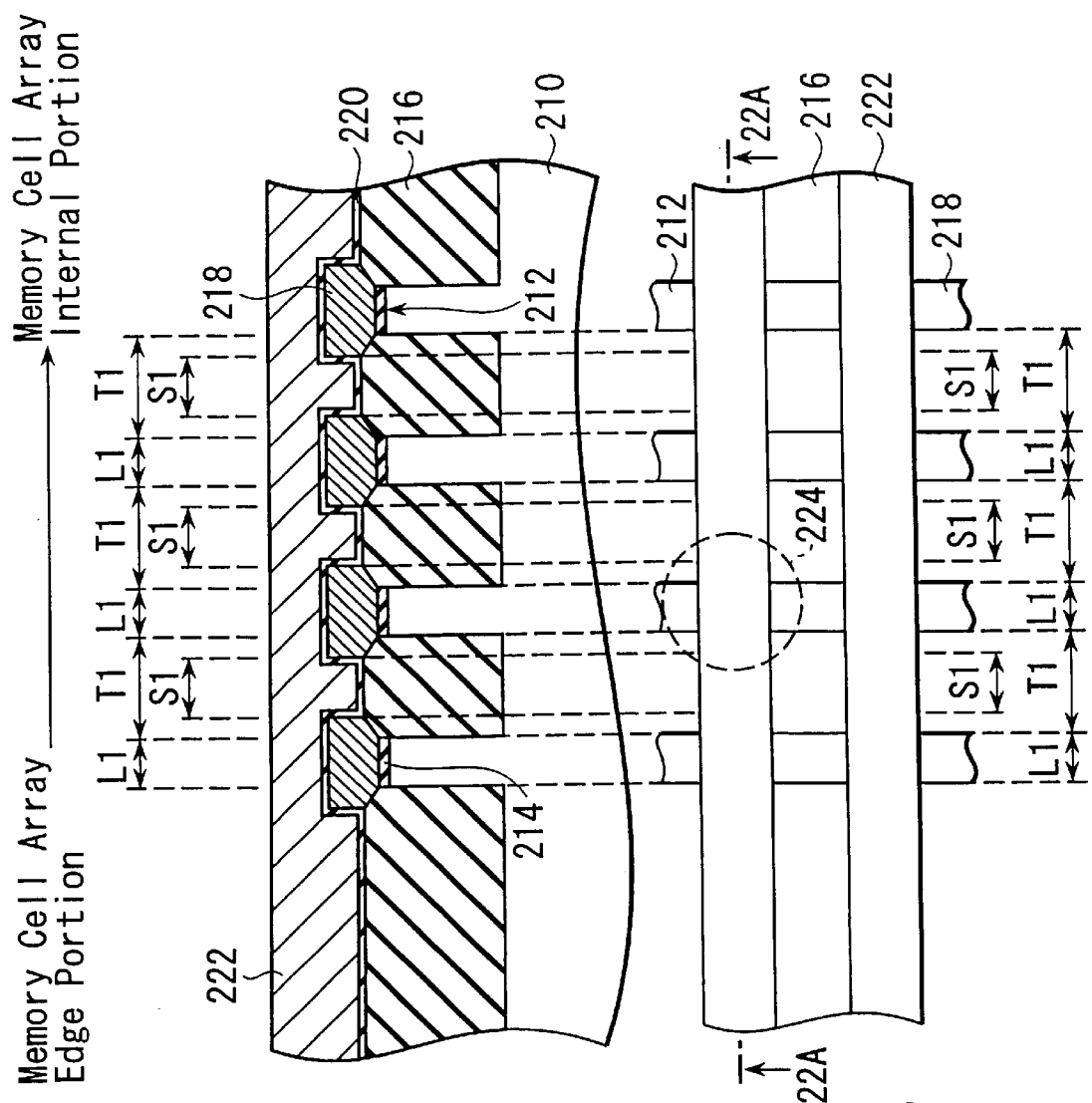

FIG. 22B is a plan view showing principal part of a memory cell array of a conventional nonvolatile semiconductor memory device. FIG. 22A is a sectional view taken along a line 22A—22A of FIG. 22B. As shown in FIGS. 22A and 22B, in this conventional nonvolatile semiconductor memory device, a plurality of floating gate electrodes 218 are formed above element regions 212 via gate insulating films 214. Each floating gate 218 is split at a position above an isolation region 216 and is isolated for each memory cell 224. A plurality of control gate electrodes 222 are formed above the plurality of floating gate electrodes 218 via an inter-gate insulating film 220.

The nonvolatile semiconductor memory device having the memory cell array shown in FIGS. 22A and 22B is an electrically erasable programmable semiconductor memory, i.e., a so-called EEPROM.

Each memory cell of the EEPROM normally comprises a MOS transistor having a gate electrode structure in which the floating gate electrode 218 and control gate electrode 222 are stacked. The floating gate electrode 218 electrically floats, and its surrounding portion is insulated by the inter-gate insulating film 220 and the like.

By injecting or removing a charge into or from this floating gate electrode 218, data of level "1" or "0" can be stored. More specifically, by applying a potential across the control gate electrode 222 and element region 212, charge injection/removal with respect to the floating gate electrode 218 is realized. The threshold value of the MOS transistor which forms the memory cell varies depending on the presence/absence of a charge, and the presence/absence of a change in threshold value corresponds to level "1" or "0".

Charge injection/removal with respect to the floating gate electrode 218 is attained by injecting an FN tunnel current or hot carrier that flows in the gate insulating film 214 or inter-gate insulating film 220.

A method of manufacturing the conventional nonvolatile semiconductor memory device shown in FIGS. 22A and 22B will be explained below using FIGS. 23 to 27 (with suffices A and B). The drawings with suffix A are sectional views corresponding to FIG. 22A, and the drawings with suffix B are plan views corresponding to FIG. 22B.

Figure 23A:
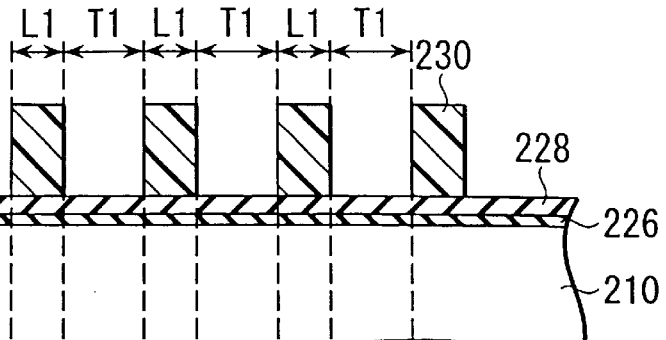
Figure 23B:
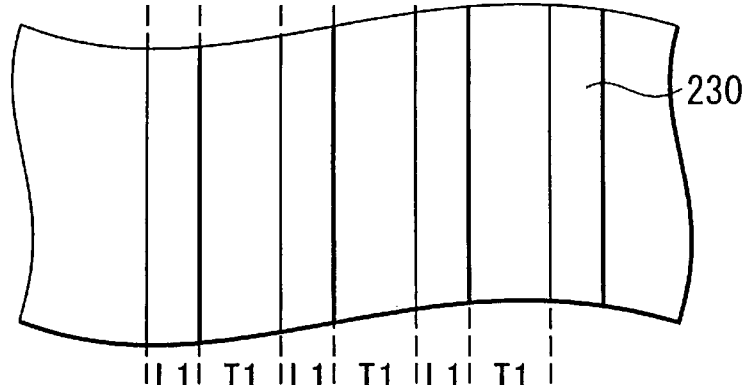

Initially, a buffer oxide film 226 and etching mask material (e.g., silicon nitride film) 228 are deposited in turn on a semiconductor substrate 210, as shown in FIGS. 23A and 23B. A photoresist pattern 230 is formed by photolithography on a region where the element regions 212 in FIGS. 22A and 22B are formed. The line width and space of the photoresist pattern 230 are respectively L1 and T1 irrespective of the memory cell array edge portion and internal portion.

Figure 24A:
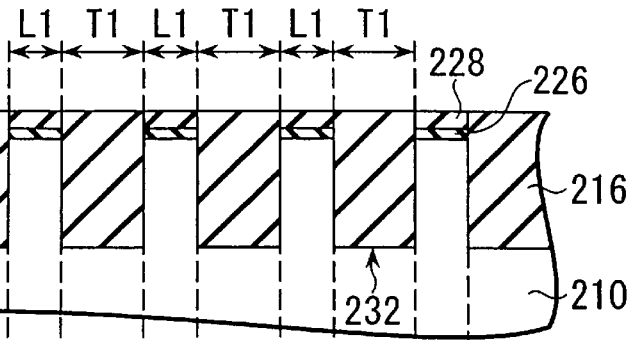
Figure 24B:
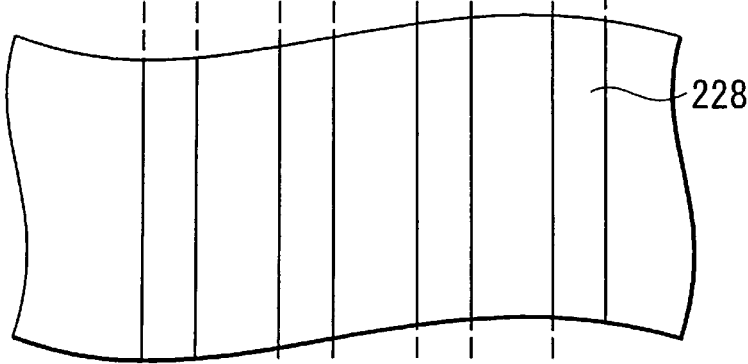

Using the photoresist pattern 230 in FIGS. 23A and 23B as an etching mask, the silicon nitride film 228 is removed. Subsequently, using the patterned silicon nitride film 228 as an etching mask, the buffer oxide film 226 and semiconductor substrate 210 are removed in turn to form a plurality of trenches 232, as shown in FIGS. 24A and 24B. An insulating film is buried in the plurality of trenches 232 to form a plurality of isolation regions 216.

Figure 25A:
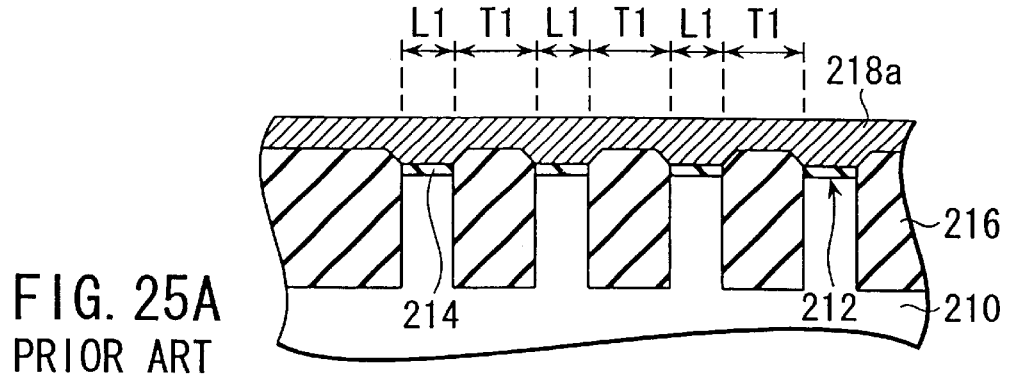
Figure 25B:
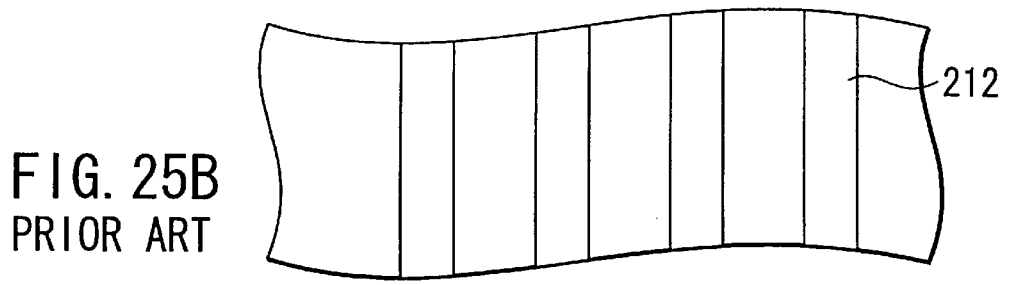
Figure 26A:
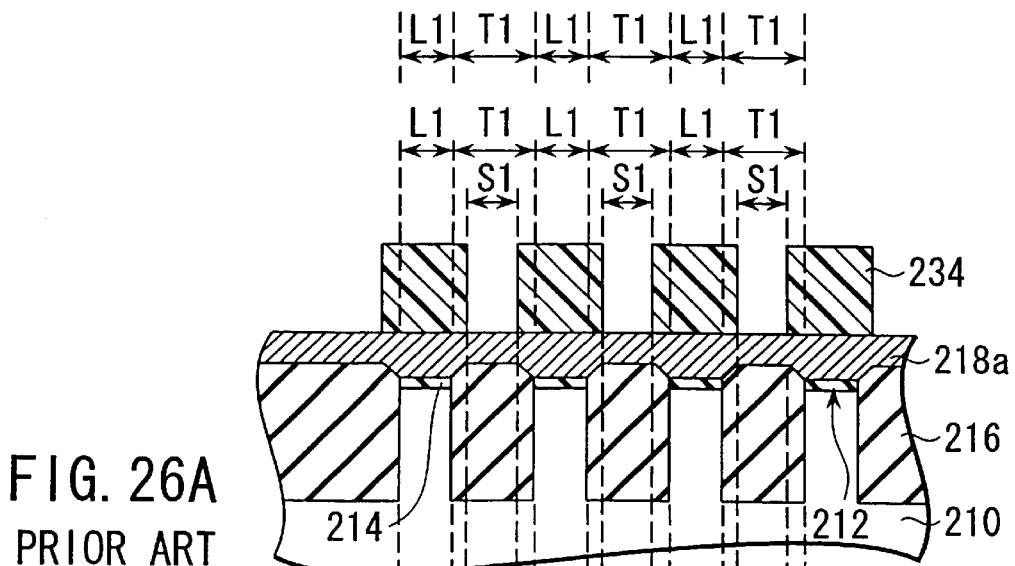
Figure 26B:
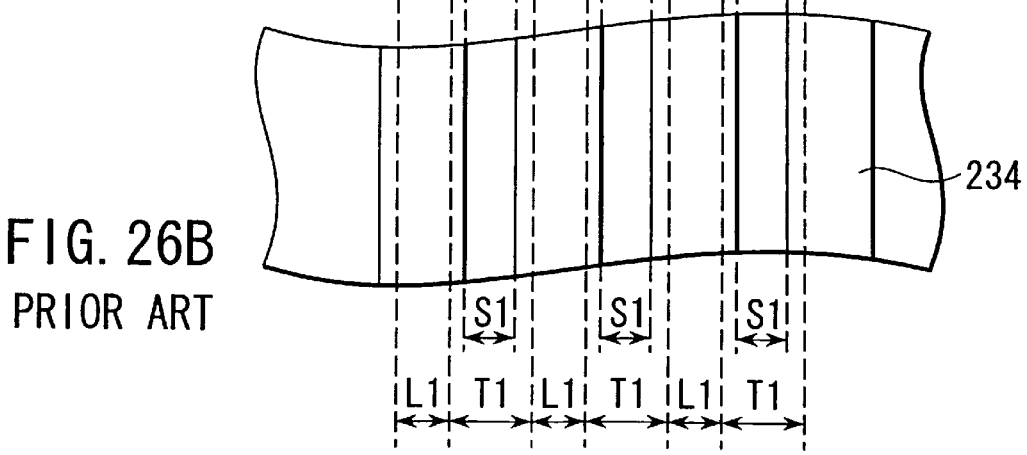

After the remaining silicon nitride film 228 and buffer oxide film 226 in FIGS. 24A and 24B are removed in turn, a gate insulating film 214 is formed on the element regions 212, as shown in FIGS. 25A and 25B. After the gate insulating film 214 is formed, a conductive material 218a that forms the floating gate electrodes 218 in FIGS. 22A and 22B is deposited on the entire surface of the semiconductor substrate 210. A photoresist pattern 234 is formed on the conductive material 218a, as shown in FIGS. 26A and 26B. Note that the space of the photoresist pattern 234 is S1 irrespective of the memory cell array edge portion and internal portion.

After the conductive material 218a is removed using the photoresist pattern 234 in FIGS. 26A and 26B as an etching mask, the photoresist pattern 234 is removed, as shown in FIGS. 27A and 27B. The inter-gate insulating film 220 and control gate electrodes 222 in FIGS. 22A and 22B are then formed to complete the nonvolatile semiconductor memory device shown in FIGS. 22A and 22B. Although not shown, after the control gate electrodes 222 are formed, an insulating interlayer forming process, wiring process, and the like are executed in turn.

The problems of the conventional nonvolatile semiconductor memory device will be discussed below. FIGS. 28A and 28B show principal part of a pattern on a reticle used in the manufacturing process of the nonvolatile semiconductor memory device shown in FIGS. 22A and 22B, in which FIG. 28A corresponds to a reticle used to transfer the photoresist pattern 230 in FIGS. 23A and 23B onto the semiconductor substrate 210, and FIGS. 28B corresponds to a reticle used to transfer the photoresist pattern 234 in FIGS. 26A and 26B onto the semiconductor substrate 210.

For example, the reticle shown in FIG. 28A is formed with a line & space pattern having a line width L1 and space T1. Process margins for the exposure amount and a focus of the exposure system near the memory cell array edge portion are smaller than those of the array internal portion, and it is difficult to form a desired pattern. For example, when the exposure amount or the focus of the exposure system varies, a pattern near the memory cell array edge portion suffers larger dimensional variations than that of the array internal portion. Especially, when the super resolution technique is used, that tendency is notable. For this reason, it is a common practice to set a memory cell located at the memory cell array edge portion or a plurality of memory cells located near the array edge portion to be dummy cells which are not electrically used. In this way, dimensional variations near the array edge portion are allowed.

Figure 29:
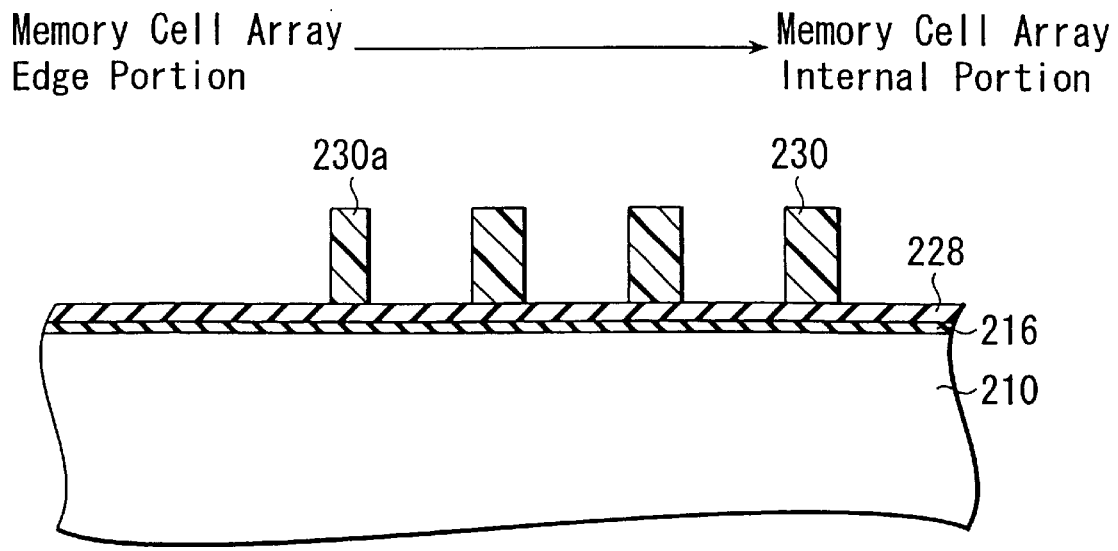
FIG. 29 is a sectional view showing an abnormality that may occur in the manufacturing processes of the semiconductor memory device, and corresponds to the same process as in FIG. 23B.

However, in practice, dimensional variations near the array edge portion may cause the following errors in the memory cell array. For example, FIG. 29 is a sectional view showing the manufacturing process of the nonvolatile semiconductor memory device shown in FIGS. 22A and 22B, and corresponds to the same process as in FIG. 23B. In case of FIG. 29, a photoresist pattern 230a at the array edge portion is formed thinner than other patterns 230. This pattern 230a at the array edge has poor stability due to its thinness, and may collapse in a later process. For example, if this pattern 230a collapses in the development process after exposure, etching is done using the pattern 230a that has collapsed as an etching mask and, as a result, a wrong pattern is formed on the semiconductor substrate 210.

Figure 30:
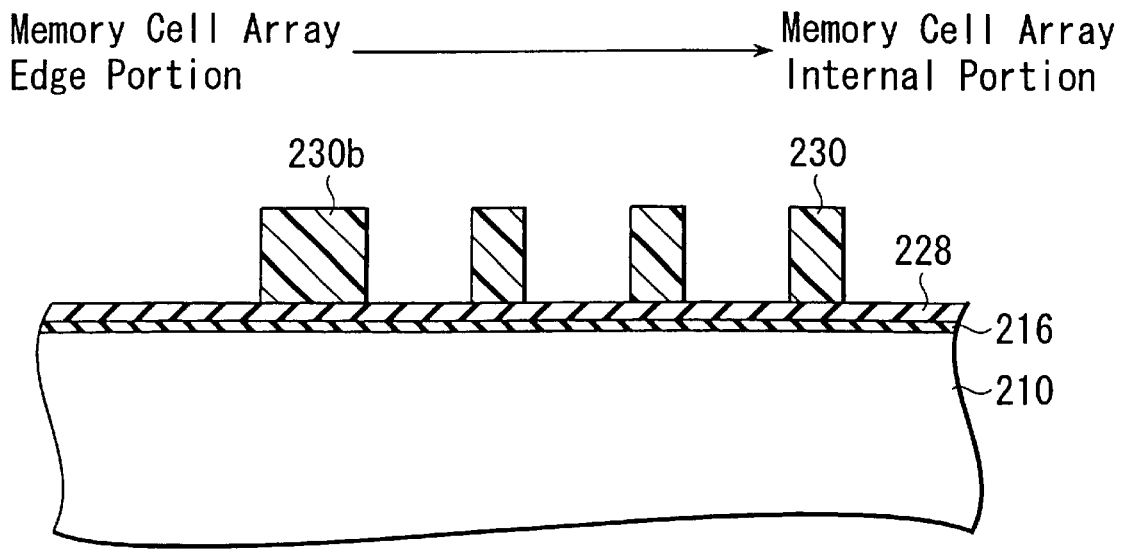
FIG. 30 is a sectional view showing another abnormality that may occur in the manufacturing processes of the semiconductor memory device, and corresponds to the same process as in FIG. 23B.
Figure 31:
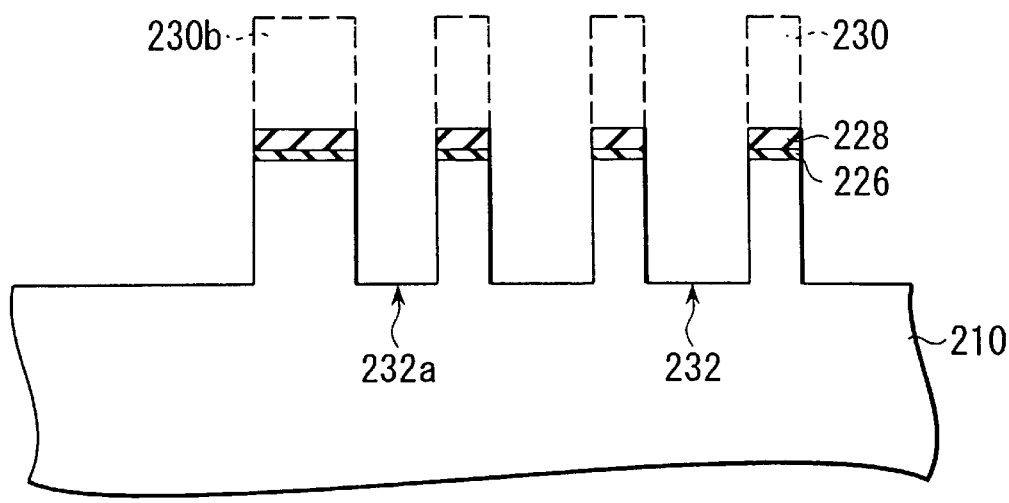
FIG. 31 is a sectional view showing the process next to FIG. 30.

Conversely, a photoresist pattern at the array edge portion may be formed thicker than other patterns due to errors of the exposure amount or focus of the exposure system. FIG. 30 is a sectional view showing the manufacturing process of the nonvolatile semiconductor memory device shown in FIG. 22A, and corresponds to the same process as in FIG. 23A. FIG. 31 is a sectional view showing the manufacturing process of the nonvolatile semiconductor memory device shown in FIG. 22A, and corresponds to a process after etching in FIG. 30. In case of FIG. 30, a photoresist pattern 230b at the array edge portion is formed thicker than other patterns 230. In this case, when the silicon nitride film 228 is removed using the photoresist patterns 230 and 230b as an etching mask, and the buffer oxide film 226 and semiconductor substrate 210 are removed using the silicon nitride film 228 as an etching mask, the width of a trench 232a at the array edge portion becomes smaller than those of trenches 232 of the array internal portion, as shown in FIG. 31. Upon burying an insulating film in these trenches 232 and 232a, the trench 232a with a smaller width is often insufficiently buried compared to other trenches 232. As a result, dust may be produced in a later process, or the control gate electrodes 222 in FIG. 22A may short-circuit.

Figure 32:
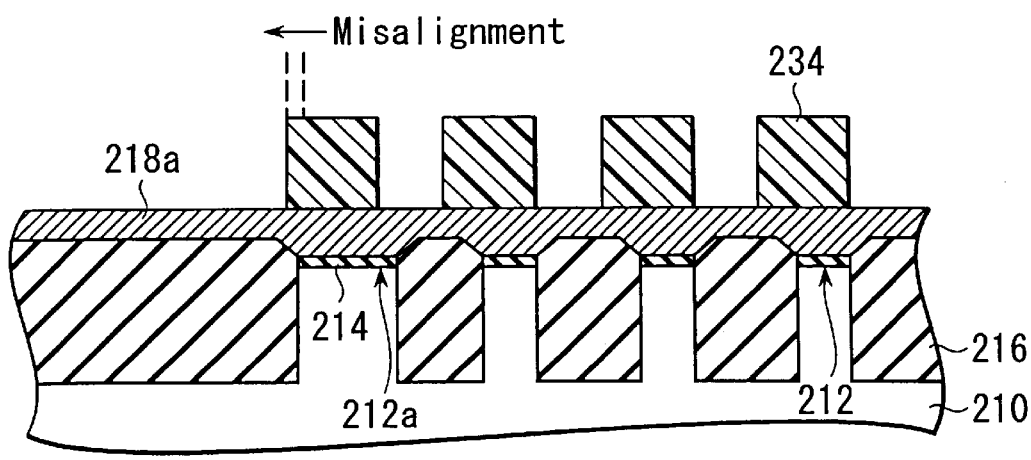
FIG. 32 is a sectional view showing still another abnormality in the manufacturing processes of the semiconductor memory device, and corresponds to the same process as in FIG. 26A.
Figure 33:
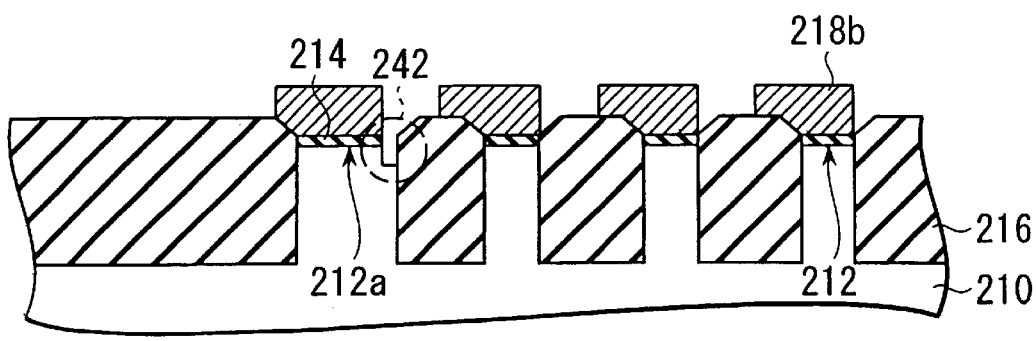
FIG. 33 is a sectional view showing still another abnormality in the manufacturing processes of the semiconductor memory device, and corresponds to the same process as in FIG. 27A.

Furthermore, formation of the trenches 232 and 232a shown in FIG. 31 poses another problem. FIG. 32 is a sectional view showing the manufacturing process of the nonvolatile semiconductor memory device in FIG. 22A, and corresponds to the same process as in FIG. 26A. FIG. 33 is a sectional view showing the manufacturing process of the nonvolatile semiconductor memory device in FIG. 22A, and corresponds to the same process as in FIG. 27A.

In FIG. 32, the width of an element region 212a at the array edge portion is formed larger than those of other element regions 212. The layout of the photoresist pattern 234 is displaced due to misalignment or the like of a reticle. As a result, a space for the pattern 234 is located above the element region 212a. When the conductive material is etched using this photoresist pattern 234, the gate insulating film 214 and element region 212a are etched to form a substrate damage portion 242, as shown in FIG. 33, resulting in errors. Furthermore, since process margins for variations of the exposure value and focus are small at the array edge portion, the aforementioned phenomenon is more pronounced.

Embodiments of the present invention that can solve the aforementioned problems will be described in detail below. The same or similar reference numerals denote the same or similar parts in the drawings used in the following description.

Seventh Embodiment

FIGS. 34A and 34B show principal part of a memory cell array of a nonvolatile semiconductor memory device according to the seventh embodiment of the present invention, in which FIG. 34B is a plan view of the memory cell array, and FIG. 34A is a sectional view taken along a line 34A—34A in FIG. 34B. In the nonvolatile semiconductor memory device according to the seventh embodiment, a plurality of floating gate electrodes 318 are formed above element regions 312 via gate insulating films 314, as in FIGS. 22A and 22B. Each floating gate 318 is split at a position above an isolation region 316 and is isolated for each memory cell 324. A plurality of control gate electrodes 322 are formed above the plurality of floating gate electrodes 318 via an inter-gate insulating film 320. A plurality of memory cells 324 form vertical and horizontal arrays, and the control gate electrodes 322 of memory cells 324 which neighbor across the isolation region 316 are connected to each other.

In the seventh embodiment, the width of the isolation region 316 is set to satisfy the following condition. That is, let T1 be the width of an isolation region 316a at the memory cell array edge portion, and T2 be the width of the isolation region in the memory cell array internal portion. Then, T1 and T2 satisfy:

$$T1 > T2 \qquad (1)$$

Also, the space between the neighboring floating fate electrodes 218 is set to satisfy the following condition. That is, let S1 be the space at the memory cell array edge portion, and S2 be the space in the memory cell array internal portion. Then, S1 and S2 satisfy:

$$S1 > S2 \qquad (2)$$

Note that a memory cell at the memory cell array edge portion is normally used as a dummy cell which is not electrically used. In the seventh embodiment, as can be seen from inequalities (1) and (2) above, since the occupation area of the dummy cell increases than that in the conventional device, the area of the memory cell array may increase accordingly. However, the memory cell array includes a very larger number of memory cells, and a slight increase in area at the memory cell array edge portion is very small relative to the area of the overall array. Hence, an increase in occupation area of the dummy cell at the array edge portion does not lead to an increase in area of the entire memory cell array.

A method of manufacturing the nonvolatile semiconductor device according to the seventh embodiment of the present invention shown in FIGS. 34A and 34B will be explained below using FIGS. 35 to 39 (with suffices A and B). Note that the drawings with suffix A are sectional views corresponding to FIG. 34A, and the drawings with suffix B are plan views corresponding to FIG. 34B.

Initially, a buffer oxide film 326 and etching mask material (e.g., silicon nitride film) 328 are deposited in turn on a semiconductor substrate 310, as shown in FIGS. 35A and 35B. Of course, before the buffer oxide film 326 and silicon nitride film 328 are stacked, a well region may be formed in the surface portion of the semiconductor substrate 310. The buffer oxide film 326 is formed to have a film thickness of, e.g., 10 nm, the silicon nitride film 328 is formed to have a film thickness of, e.g., 100 nm, and the semiconductor substrate 210 is, e.g., an n- or p-type silicon substrate.

Figure 40A:
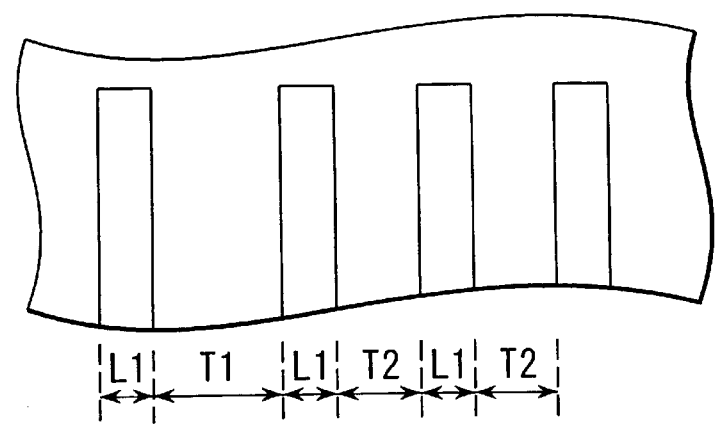
FIG. 40A shows principal part of a pattern on a reticle used to transfer a photoresist pattern 330 in FIG. 35B onto a semiconductor substrate 310.

A photoresist pattern 330 is formed by photolithography on a region where the element regions 312 in FIGS. 34A and 34B are formed. The photoresist pattern 330 has apertures which specify formation regions of the isolation regions 316. The photoresist pattern 330 has a space T1 at the array edge portion and T2 in the array internal portion, and these spaces satisfy T1>T2. FIG. 40A shows principal part of a pattern on a reticle used to transfer the photoresist pattern 330 onto the semiconductor substrate 310.

Using the photoresist pattern 330 in FIGS. 35A and 35B as an etching mask, the silicon nitride film 328 is removed. After the photoresist pattern 330 is removed, the buffer oxide film 326 and semiconductor substrate 310 are removed in turn using the patterned silicon nitride film 328 as an etching mask to form a plurality of trenches 332 and 332b as formation regions of the isolation regions 316 in FIGS. 34A and 34B.

An insulating film is buried in the plurality of trenches 332 and 332b to form a plurality of isolation regions 316.

The isolation regions 316 are formed using, e.g., a CMP technique. That is, after the plurality of trenches 332 and 332b are formed, an insulating film is deposited on the semiconductor substrate so as to completely bury these trenches 332 and 332b. An extra insulating film is removed by the CMP technique to leave the insulating film only in the trenches 332.

The buffer oxide film 326 and the silicon nitride film 328 serving as the etching mask of the semiconductor substrate 310 are then removed. Normally, the silicon nitride film 328 is selectively removed by wet etching using hot phosphoric acid. Subsequently, the buffer oxide film 326 is removed by wet etching using a dilute hydrofluoric acid solution. After these films are removed, a gate oxide film 314, e.g., a very thin oxide film is formed by thermal oxidation on the surface of the semiconductor substrate 310.

As shown in FIGS. 37A and 37B, a conductive material 318a that forms the floating gates 318 in FIGS. 34A and 34B, e.g., an amorphous silicon film or polysilicon film is deposited on the entire surface of the semiconductor substrate 310.

Figure 40B:
FIG. 40B shows principal part of a pattern on a reticle used to transfer a photoresist pattern 334 in FIG. 38B onto the semiconductor substrate 310.

As shown in FIGS. 38A and 38B, a photoresist pattern 334 is formed on the conductive material 218a. Note that the photoresist pattern 334 has a space S1 at the array edge portion, and S2 in the array internal portion, and these spaces satisfy S1>S2. FIG. 40B shows principal part of a pattern on a reticle used to transfer the photoresist pattern 334 onto the semiconductor substrate 310.

Figure 39A:
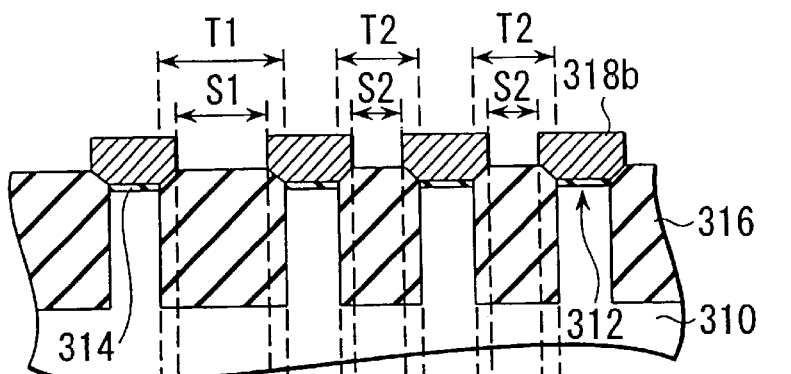
Figure 39B:
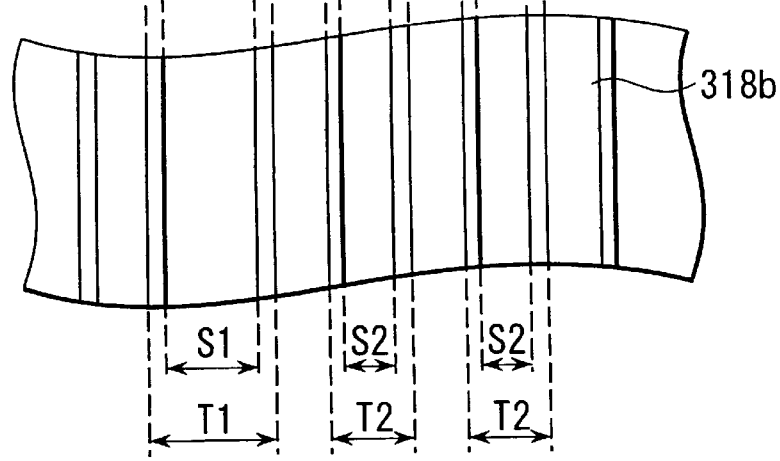

After the conductive material 318a is removed using the photoresist pattern 334 in FIGS. 38A and 38B as an etching mask, the photoresist pattern 334 is removed, as shown in FIGS. 39A and 39B. The inter-gate insulating film 320 and control gate electrodes 322 in FIGS. 34A and 34B are then formed to complete the nonvolatile semiconductor memory device shown in FIGS. 34A and 34B.

The inter-gate insulating film 320 comprises an ONO film as a multilayered structure of an oxide film/silicon nitride film/oxide film, and each control gate electrode 322 is formed of a conductive material as in the floating gate electrode 318. As the conductive material, for example, an amorphous silicon film, polysilicon film, or a multilayered film of these films and a tungsten film or tungsten silicide film is typically used. Although not shown, after the control gate electrodes 322 are formed, an insulating interlayer forming process, wiring process, and the like are executed in turn.

In the nonvolatile semiconductor memory device according to the seventh embodiment of the present invention, as shown in FIGS. 35A and 35B, the spaces of the photoresist pattern 330 which specify the widths of the isolation regions 316 satisfy T1(array edge portion)>T2 (array internal portion). That is, as shown in FIG. 40A, the spaces of the pattern on the reticle used to transfer the photoresist pattern 330 onto the semiconductor substrate 310 are specified in advance to satisfy T1 (array edge portion)>T2 (array internal portion). In correspondence with these spaces, as shown in FIGS. 38A and 38B, the spaces of the photoresist pattern 334 that specify the spaces between the floating gate electrodes 318 satisfy S1 (array edge portion)>S2 (array internal portion). That is, as shown in FIG. 40B, the spaces of the pattern on the reticle used to transfer the photoresist pattern 334 onto the semiconductor substrate 310 are specified in advance to satisfy S1 (array edge portion)>S2 (array internal portion).

For this reason, even when the photoresist pattern 330 at the array edge portion is formed thick, the space at the array edge portion can be prevented from becoming extremely smaller than those in the array internal portion. In this way, the burying property of an insulating film at the array edge portion that poses a problem in the prior art can be improved, and various errors can be suppressed.

Furthermore, even when dimensional variations at the array edge portion or misalignment of a reticle occurs, the space between the floating gate electrodes 318 can be prevented from being located above the element region 312 at the array edge portion. In this manner, any substrate damage at the array edge portion that poses a problem in the prior art can be prevented, and the manufacturing yield and reliability can be improved.

Eighth Embodiment

FIGS. 41A and 41B show principal part of a memory cell array of a nonvolatile semiconductor memory device according to the eighth embodiment of the present invention, in which FIG. 41B is a plan view of the memory cell array, and FIG. 41A is a sectional view taken along a line 41A—41A in FIG. 41B.

In the eighth embodiment, the widths of the element region 312 are set to satisfy the following condition in addition to the seventh embodiment. That is, let L1 be the width of an element region 312b at the memory cell array edge portion, and L2 be the width of an element region 312 in the memory cell array internal portion. Then, L1 and L2 satisfy:

$$L1 > L2 \tag{3}$$

In this manner, in the nonvolatile semiconductor memory device according to the eighth embodiment of the present invention, lines of a photoresist pattern (see the photoresist 330 in FIGS. 35A and 35B) that specify the widths of the element regions 312 satisfy L1 (array edge portion)>L2 (array internal portion). That is, as shown in FIG. 42B, lines of a pattern on a reticle used to transfer this photoresist pattern onto the semiconductor substrate 310 are specified in advance to satisfy L1 (array edge portion)>L2 (array internal portion).

For this reason, according to the eighth embodiment of the present invention, in addition to the effects of the seventh embodiment, even when the photoresist pattern 330 at the array edge portion is formed thin, the width that can prevent that pattern from collapsing can be maintained. As a result, formation of a wrong pattern due to the photoresist that has collapsed can be prevented.

Ninth Embodiment

Figure 43A:
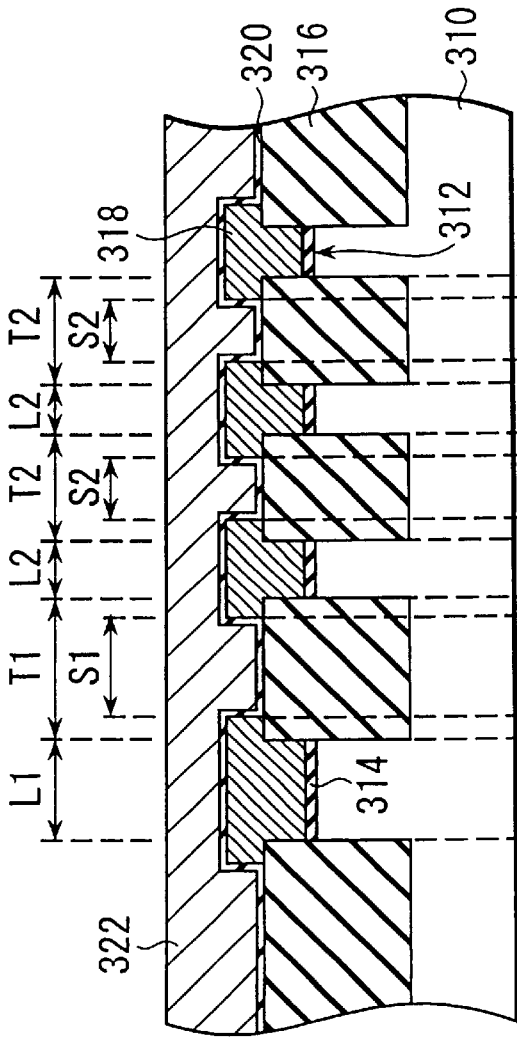
Figure 43B:
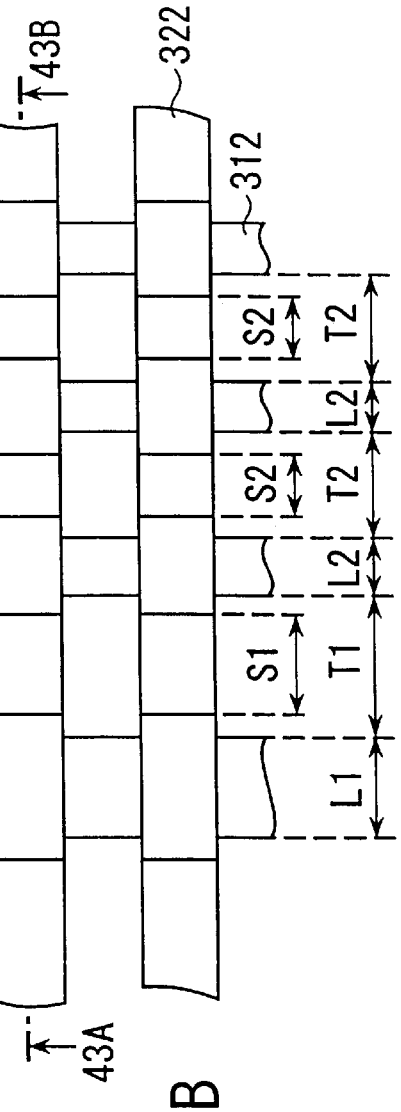

FIGS. 43A and 43B show principal part of a memory cell array of a nonvolatile semiconductor memory device according to the ninth embodiment of the present invention, in which FIG. 43B is a plan view of the memory cell array, and FIG. 43A is a sectional view taken along a line 43A—43A in FIG. 43B. Element isolation in the seventh and eighth embodiments is attained by an STI (shallow trench isolation) structure, but the ninth embodiment adopts a self-align STI (SA-STI) structure as the element isolation structure. In the ninth embodiment, the widths of the isolation regions 316, the spaces between the floating gate electrodes 318, and the widths of the element regions 312 satisfy the same relations as in the eighth embodiment.

A method of manufacturing the nonvolatile semiconductor memory device according to the ninth embodiment of the present invention shown in FIGS. 43A and 43B will be explained below using FIGS. 44 to 48 (with suffices A and B). Note that the drawings with suffix A are sectional views corresponding to FIG. 43A, and the drawings with suffix B are plan views corresponding to FIG. 43B.

Initially, a gate insulating film 314, e.g., a very thin oxide film is formed by thermal oxidation on the entire surface of a semiconductor substrate 310, and a conductive material 318c that forms the floating gate electrodes 318 is then deposited, as shown in FIGS. 44A and 44B. Furthermore, a mask material 336, e.g., a silicon nitride film, is deposited on the conductive material 318c. A photoresist pattern 338 is formed on the silicon nitride film 336 by photolithography. Note that the photoresist pattern 338 has a space T1 at the array edge portion and T2 in the array internal portion, and these spaces satisfy T1>T2. Also, the pattern 338 has a width L1 at the array edge portion and L2 in the array internal portion, and these widths satisfy L1>L2.

The silicon nitride film 336 is removed using the photoresist pattern 338 as an etching mask. After the photoresist pattern 338 is removed, the conductive material 318c, gate insulating film 314, and semiconductor substrate 310 are removed in turn using the patterned silicon nitride film 336 as an etching mask, thus forming a plurality of trenches 332, as shown in FIGS. 45A and 45B. With this etching, the element regions 312 and floating gate electrodes 318 in FIGS. 43A and 43B can be formed by self-alignment.

As shown in FIGS. 45A and 45B, an insulating film is buried in the plurality of trenches 332 to form a plurality of isolation regions 316. The isolation regions 316 are formed using, e.g., a CMP technique. That is, after the plurality of trenches 332 are formed, an insulating film is deposited on the semiconductor substrate so as to completely bury these trenches 332. An extra insulating film is removed by the CMP technique to leave the insulating film only in the trenches 332.

The silicon nitride film 336 that remains on the semiconductor substrate 310 is then removed. Normally, the silicon nitride film 336 is selectively removed by wet etching using hot phosphoric acid. With this removal, the top portions of the conductive material 318c are exposed.

As shown in FIGS. 46A and 46B, a conductive material 318d is deposited on the entire surface of the semiconductor substrate 310. At this time, the conductive materials 318c and 318c are electrically connected. The conductive material 318d comprises an amorphous silicon film or polysilicon film as in the conductive material 318c.

Figures 47A, 47B:
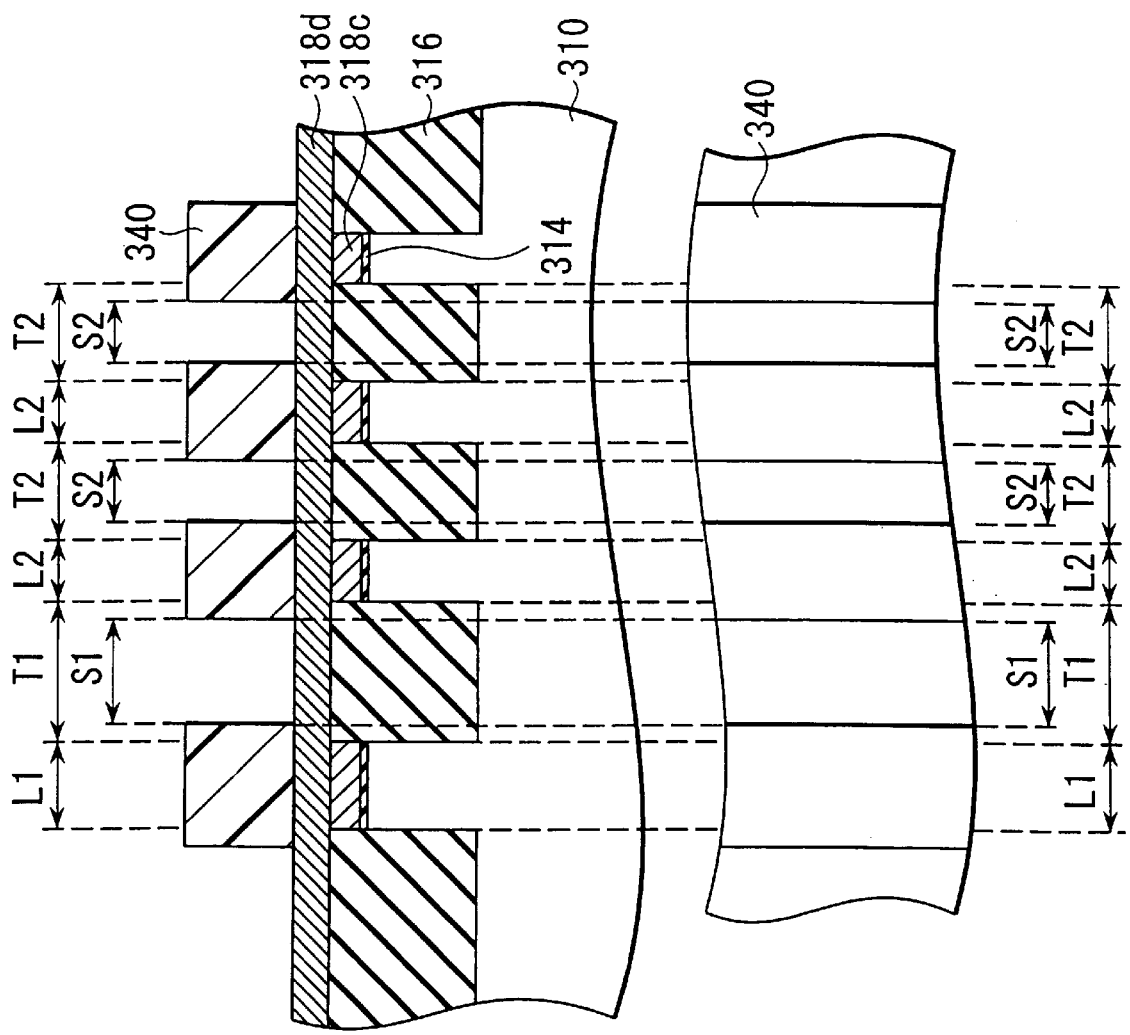

As shown in FIGS. 47A and 47B, a photoresist pattern 340 is formed on the conductive material 318d. Note that the photoresist pattern 340 has a space S1 at the array edge portion, and S2 in the array internal portion, and these spaces satisfy S1>S2.

After the conductive material 318d is removed using the photoresist pattern 340 in FIGS. 47A and 47B as an etching mask, the photoresist pattern 340 is removed, as shown in FIGS. 48A and 48B. At this time, the floating gate electrodes 318 formed by the conductive materials 318c and 318d are completed.

The inter-gate insulating film 320 and control gate electrodes 322 in FIGS. 43A and 43B are then formed to complete the nonvolatile semiconductor memory device shown in FIGS. 43A and 43B. The inter-gate insulating film 320 comprises an ONO film as a multilayered structure of an oxide film/silicon nitride film/oxide film, and each control gate electrode 322 is formed of a conductive material as in the floating gate electrode 318. As the conductive material, for example, an amorphous silicon film, polysilicon film, or a multilayered film of these films and a tungsten film or tungsten silicide film is normally used. Although not shown, after the control gate electrodes 322 are formed, an insulating interlayer forming process, wiring process, and the like are executed in turn.

As described above, according to the ninth embodiment of the present invention, the same effects as in the seventh and eighth embodiments can be obtained even in a nonvolatile semiconductor memory device having a self-align STI structure.

10th Embodiment

FIGS. 49A and 49B show principal part of a memory cell array of a nonvolatile semiconductor memory device according to the ninth embodiment of the present invention, in which FIG. 49B is a plan view of the memory cell array, and FIG. 49A is a sectional view taken along a line 49A—49A in FIG. 49B.

Element isolation in the seventh and eighth embodiments is attained by an STI structure, but the 10th embodiment adopts a LOCOS structure as the element isolation structure. In the 10th embodiment, the widths of the isolation regions 316, the spaces between the floating gate electrodes 318, and the widths of the element regions 312 satisfy the same relations as in the eighth embodiment.

In this way, according to the 10th embodiment of the present invention, the same effects as in the seventh and eighth embodiments can be obtained even when the LOCOS structure is adopted as the element isolation structure.

11th Embodiment

FIGS. 50A and 50B show principal part of a memory cell array of a nonvolatile semiconductor memory device according to the ninth embodiment of the present invention, in which FIG. 50B is a plan view of the memory cell array, and FIG. 50A is a sectional view taken along a line 50A—50A in FIG. 50B.

In the seventh to 10th embodiments, only the width of the isolation region 316, the space between floating gate electrodes, and the width of the element region 312 at the memory cell array edge portion are set to be larger than those in the array internal portion. In the 11th embodiment, not only the isolation region 316 and the like at the array edge portion but also the widths of the isolation regions 316 which are located at the second position, third position, . . . from the array edge portion toward the internal portion are set to be larger than those in the array internal portion.

As shown in FIGS. 50A and 50B, in the nonvolatile semiconductor memory device according to the 11th embodiment, first, the widths of the isolation regions 316 are set to satisfy the following condition. That is, let T1 be the width of the isolation region 316 at the memory cell array edge portion, T2 be the width of the second isolation region 316 from the memory cell array edge portion toward the internal portion, and T3 be the width of the isolation region 316 in the memory cell array internal portion. Then, T1, T2, and T3 satisfy:

$$T1>T2>T3 \tag{4}$$

Second, the spaces between neighboring floating gate electrodes are set to satisfy the following condition. That is, let S1 be the space at the memory cell array edge portion, S2 be the second space from the memory cell array edge portion toward the internal portion, and S3 be the space in the memory cell array internal portion. Then, S1, S2, and S3 satisfy:

$$S1>S2>S3 \quad (5)$$

Third, let L1 be the width of the element region 312 at the memory cell array edge portion, L2 be the width of the second element region from the memory cell array edge portion toward the internal portion, and L3 be the width of the element region 312 in the memory cell array internal portion. Then, L1, L2, and L3 satisfy:

$$L1>L2>L3 \quad (6)$$

In this manner, according to the 11th embodiment of the present invention, the effects of the seventh and eighth embodiments can be attained more remarkably.

12th Embodiment

In the seventh to 11th embodiments, as shown in FIGS. 34, 41, 43, 49, and 50 (with suffices A and B), the floating gate electrode 318 at the memory cell array edge portion is completely removed if it is located at a position outside the array. However, the present invention is not limited to such specific structure. For example, as shown in FIGS. 51A and 51B, the floating gate electrode 318 may remain even at a position 344 outside the array.

Figures 51A, 51B:
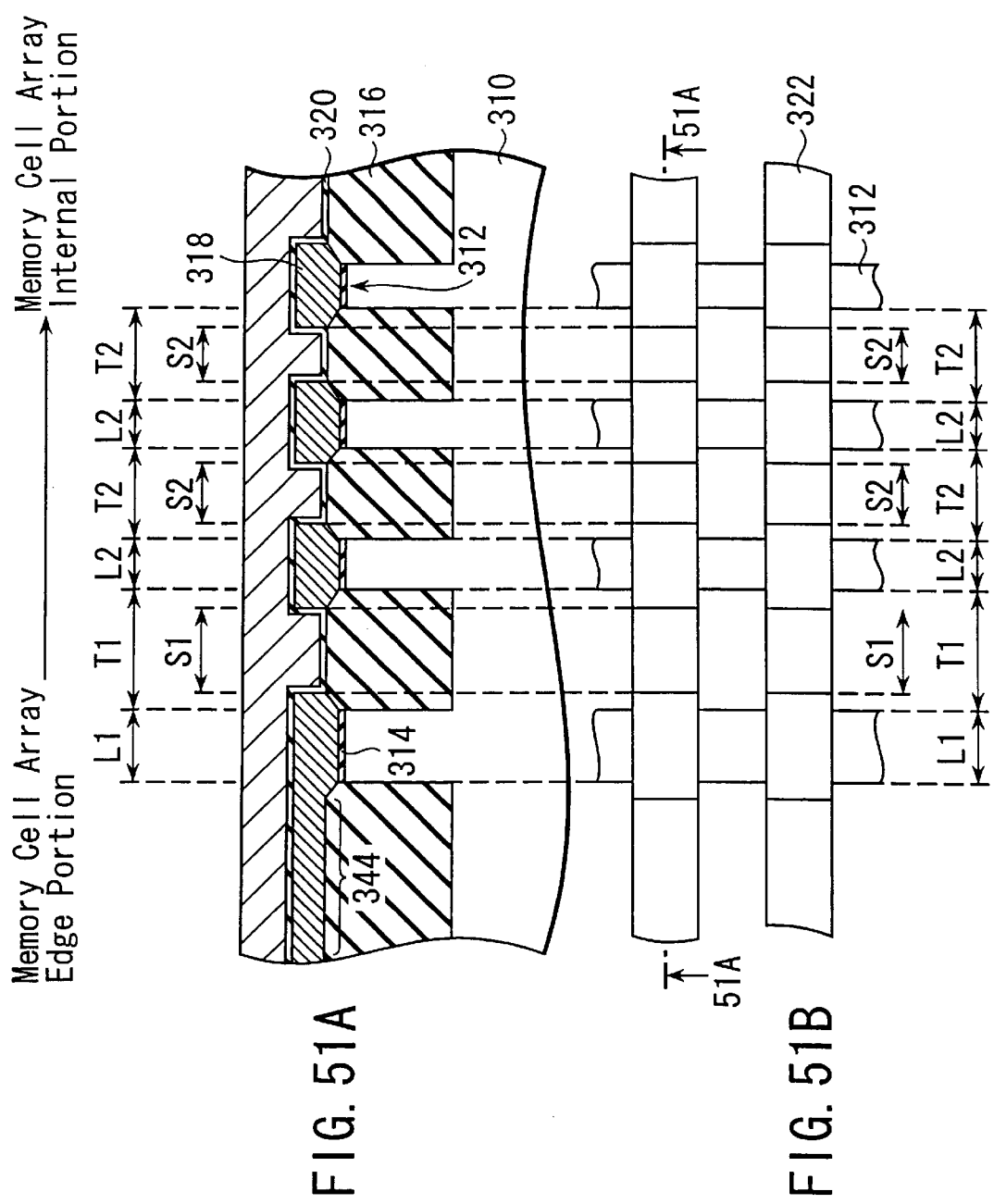

Since the structure shown in FIGS. 51A and 51B is substantially the same as that in FIGS. 41A and 41B except for the floating gate electrode at the memory cell array edge portion (at the position 344 outside the array), a detailed description thereof will be omitted.

The seventh to 12th embodiments have been explained taking a NAND nonvolatile semiconductor memory device as an example. However, the present invention is not limited to NAND cell type, and can be applied to memory cell array structures of electrically erasable programmable nonvolatile semiconductor memory devices such as NOR, AND, DINOR devices, and the like. Also, the present invention is not limited to nonvolatile type but can be applied to all semiconductor memory devices.

In the reticle according to the seventh to 12th embodiments, a photoresist pattern cannot often be formed according to the dimensions of the reticle due to irregularity of a pattern near the array edge. For example, correction for setting the line width at the array edge portion to be larger than that in the array internal portion may be made.

In the seventh to 12th embodiments, a positive type resist, the exposed portion of which becomes a space of the photoresist is used. Alternatively, a negative type resist, the exposed portion of which becomes a line of the photoresist may be used. In this case, the reticle pattern according to each embodiment can be reversed.

Furthermore, in the reticle according to the seventh to 12th embodiments, its opaque portion may use chromium or the like that perfectly intercepts light, or an attenuated phase shifting mask that transmits some light components or changes the phase of incoming light. Also, an alternating phase shifting mask having different phases of neighboring line patterns may be used.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:

a semiconductor substrate;

a first line & space pattern set in which a first, a second, a third, and a fourth line pattern, each of which has a line width L and is made of a conductor, are aligned in turn via a line space S on a first region on the semiconductor substrate;

a second line & space pattern set in which a fifth and a sixth line pattern, each of which has not less than the line width L and is made of a conductor, are aligned in turn via not less than the line space S on a second region on the semiconductor substrate; and a third line & space pattern set in which a seventh line pattern, which is connected to the first line pattern and the fifth line pattern and is made of a conductor, and an eighth line pattern, which is connected to the third line pattern and the sixth line pattern and is made of a conductor, are formed on a third region present between the first region and the second region on the semiconductor substrate, the second line pattern terminating at a boundary position between the first region and the third region, and the fourth line pattern terminating at a boundary position between the third region and the second region.

2. The device according to claim 1, wherein the seventh line pattern being formed with a line width thereof changing in a middle of a lengthwise direction in the third region, a line width on a side of the fifth line pattern being larger than a line width on a side of the first line pattern, and the eighth line pattern being formed with a line width thereof changing in a middle of a lengthwise direction in the third region, a line width on a side of the sixth line pattern being larger than a line width on a side of the third line pattern.

3. The device according to claim 2, wherein line width change positions of the seventh and the eighth line pattern are separated not less than S from a boundary position between the third region and the first region in the lengthwise direction, and not less than L from a boundary position between the third region and the second region in the lengthwise direction.

4. The device according to claim 1, wherein a space between the eighth and the fourth line pattern is S in the third region.

5. The device according to claim 1, wherein the first region is a region where a memory cell array is formed, and the second region is a region where a memory cell peripheral circuit is formed.

6. The semiconductor device comprising:

a semiconductor substrate;

a first line & space pattern set in which n (n is an even number) line patterns made of a conductor are aligned in turn via a line space S on a first region on the semiconductor substrate;

a second line & space pattern set in which n/2 line patterns made of a conductor are aligned in turn via a predetermined line space on a second region on the semiconductor substrate; and a third line & space pattern set in which n/2 line patterns which are made of a conductor and are connected to every other n/2 line patterns of the first line & space pattern set and to the n/2 line patterns of the second line & space pattern set are formed on a third region present between the first region and the second region on the semiconductor substrate, and each of n/2 line patterns, which are not connected to the second line & space pattern set, of the first line & space pattern set terminating at one of a boundary position between the first region and the third region, a boundary position between the third region and the second region, and a position in the third region.

7. The device according to claim 6, wherein each line pattern of the third line & space pattern set being formed with a line width thereof changing in a middle of a lengthwise direction in the third region and a line width on a side of the second region becoming larger than a line width on a side of the first region.

8. The device according to claim 7, wherein terminal positions of the n/2 line patterns, which are not connected to the second line $ space pattern set, of the first line $ space pattern set become closer to the second region in accordance with an aligning order of the n/2 line patterns, and line width change positions of the third line $ space pattern set become closer to the second region in accordance with an aligning order of the third line & space pattern set.

9. The device according to claim 6, wherein a space between neighboring ones of the line patterns in the third region is S.

10. The device according to claim 6, wherein the first region is a region where a memory cell array is formed, and the second region is a region where a memory cell peripheral circuit is formed.

11. A semiconductor device comprising:

a semiconductor substrate;

a first, a second, a third, and a fourth line & space pattern set in each of which n line patterns made of a conductor are aligned in turn at a pitch P1 via a first line space on a first region on the semiconductor substrate;

a fifth and a sixth line & space pattern set in each of which n line patterns made of a conductor are repeated at a pitch of P2 not less than P1 via a second line space on a second region on the semiconductor substrate; and a seventh line & space pattern set in which n line patterns, which are made of a conductor and are connected to the n line patterns of the second line & space pattern set and the n line patterns of the fifth line & space pattern set, are repeated with a line space interposed therebetween, and an eighth line & space pattern set in which n line patterns, which are made of a conductor and are connected to the n line patterns of the third line & space pattern set and the n line patterns of said sixth line & space pattern set, are repeated with a line space interposed therebetween, the line patterns of the first and the fourth line & space pattern set terminating at a boundary position between the first region and the third region, and a position in the third region, and the line patterns of the seventh and the eighth line & space pattern set including portions in which the lines run obliquely with respect to a lengthwise direction of the patterns on the first region, and a pitch P3 of the oblique line patterns satisfying P1<P3<P2.

12. The device according to claim 11, wherein the first region is a region where a memory cell array is formed, and the second region is a region where a memory cell peripheral circuit is formed.

13. The device according to claim 12, wherein the first region is a region where a memory cell array of a NAND flash memory is formed, and the second region is a region where a memory cell peripheral circuit is formed, and the n line patterns of the line & space pattern in the first region are connected to gates of a plurality of memory cells which are connected in series to form each unit block of the memory cell array, and gates of select transistors which are connected in series to neighbor across the plurality of memory cells.

14. A semiconductor memory device comprising:

a semiconductor substrate;

a plurality of isolation regions formed on a major surface of the semiconductor substrate;

a plurality of element regions formed on the major surface of the semiconductor substrate and surrounded by the isolation regions; and a plurality of memory cells formed on the element regions, the plurality of memory cells forming a memory cell array, and each of the memory cells having a gate electrode, a width of the isolation region at an end portion of the memory cell array of the plurality of isolation regions being larger than a width of the isolation region in an internal portion of the memory cell array, and a spacing between neighboring ones of the gate electrodes at the end portion of the memory cell array of the plurality of isolation regions being larger than a spacing between neighboring ones of the gate electrodes in an internal portion of the memory cell array.

15. The device according to claim 14, wherein a width of the element region at the end portion of the memory cell array of the plurality of element regions is larger than a width of the element region in the internal portion of the memory cell array.

16. The device according to claim 15, wherein a width $Ln$ of an n-th (n: a natural number) element region from the end portion of the memory cell array toward the internal portion of the plurality of element regions satisfies:

$$Ln-1 > Ln > Ln+1$$

17. The device according to claim 14, wherein a width $Tn$ of an n-th (n: a natural number) isolation region from the end portion of the memory cell array toward the internal portion of the plurality of isolation regions satisfies:

$$Tn-1 > Tn > Tn+1$$

18. The device according to claim 14, wherein a spacing $Sn$ between an n-th (n: a natural number) gate electrode from the end portion of the memory cell array toward the internal portion, and the neighboring ones of the gate electrodes satisfies:

$$Sn-1 > Sn > Sn+1$$

* * * * *